United States Patent
Nakanishi

(10) Patent No.: US 9,449,926 B2
(45) Date of Patent: Sep. 20, 2016

(54) SEMICONDUCTOR DEVICE

(71) Applicant: Renesas Electronics Corporation, Tokyo (JP)

(72) Inventor: Sho Nakanishi, Ibaraki (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 0 days.

(21) Appl. No.: 14/935,481

(22) Filed: Nov. 9, 2015

(65) Prior Publication Data

US 2016/0163654 A1    Jun. 9, 2016

(30) Foreign Application Priority Data

Dec. 3, 2014  (JP) ................. 2014-245414

(51) Int. Cl.
| | | |
|---|---|---|
| H01L 29/74 | (2006.01) | |
| H01L 23/552 | (2006.01) | |
| H01L 29/868 | (2006.01) | |
| H01L 29/739 | (2006.01) | |
| H01L 27/06 | (2006.01) | |

(52) U.S. Cl.
CPC ......... *H01L 23/552* (2013.01); *H01L 27/0664* (2013.01); *H01L 29/7397* (2013.01); *H01L 29/868* (2013.01)

(58) Field of Classification Search
CPC ............ H01L 23/552; H01L 27/0664; H01L 29/7397; H01L 29/868
USPC ................................. 257/140, 109
See application file for complete search history.

(56) References Cited

U.S. PATENT DOCUMENTS

| | | |
|---|---|---|
| 9,035,434 B2 | 5/2015 | Nakamura |
| 9,087,809 B2 * | 7/2015 | Veeramma .......... H01L 29/0684 |
| 2012/0018846 A1 | 1/2012 | Baburske et al. |
| 2014/0061875 A1 | 3/2014 | Ogura et al. |

FOREIGN PATENT DOCUMENTS

JP         2012-119716 A      6/2012

OTHER PUBLICATIONS

Extended European Search Report received in corresponding European Application No. 15195968.1 dated Apr. 26, 2016. Schulze, H. et al., "Limiting Factors of the Safe Operating Area for Power Devices", IEEE Transactions on Electron Devices, IEEE Service Center, pp. 551-562, vol. 60, No. 2, Feb. 1, 2013, Piscataway, NJ. Pfaffenlehner, M. et al., "Optimization of Diodes using the SPEED concept and CIBH", Power Semiconductor Devices and ICS (ISPSD), 2011 IEEE 23rd International Symposium ON, May 23, 2011, pp. 108-111.

* cited by examiner

*Primary Examiner* — Tu-Tu Ho
(74) *Attorney, Agent, or Firm* — Mattingly & Malur, PC

(57) ABSTRACT

In a back surface hole injection type diode, by more effectively securing the effect of hole injection from the back surface of a semiconductor substrate, the performance of a semiconductor device is improved. In the semiconductor device, in a diode formed of a P-N junction including an anode P-type layer formed in the main surface of a semiconductor substrate and a back surface $N^+$-type layer formed in the back surface of the semiconductor substrate, a back surface $P^+$-type layer is formed in the back surface, and a surface $P^+$-type layer is formed in the main surface right above the back surface $P^+$-type layer to thereby promote the effect of hole injection from the back surface.

15 Claims, 17 Drawing Sheets

SEMICONDUCTOR DEVICE

CROSS-REFERENCE TO RELATED APPLICATIONS

The disclosure of Japanese Patent Application No. 2014-245414 filed on Dec. 3, 2014 including the specification, drawings and abstract is incorporated herein by reference in its entirety.

BACKGROUND

The present invention relates to a semiconductor device, and can be utilized for manufacturing a semiconductor device including diodes for example.

As a high breakdown voltage device, a diode is known which includes a P-type anode layer in the main surface of the semiconductor substrate and includes an N-type cathode layer in the back surface of the semiconductor substrate.

In Japanese Unexamined Patent Application Publication No. 2012-119716, it is described that, in a diode including a P-type anode layer in the main surface of the semiconductor substrate and including an N-type cathode layer in the back surface, a P-type layer for injecting holes into the cathode layer in the back surface at the time of the recovery operation is arranged in the back surface.

SUMMARY

In such back surface hole injection type diode as described in Japanese Unexamined Patent Application Publication No. 2012-119716, there is a problem that, by arranging the P-type layer in the back surface of the semiconductor substrate, the area right above the P-type layer hardly functions as a diode and the forward voltage drop increases. Further, in the back surface hole injection type diode, a problem of a large loss at the time of the recovery operation, a problem of generation of a noise by ringing, and so on also occur.

Other problems and new features will be clarified from the description of the present specification and the attached drawings.

A semiconductor device that is an embodiment is a diode including a P-type anode layer formed in the main surface of a semiconductor substrate, an N-type cathode layer formed in the back surface of the semiconductor substrate, a first P-type layer formed in the back surface of the semiconductor substrate alongside the cathode layer, and a second P-type layer formed in the main surface of the semiconductor substrate at the position right above the first P-type layer.

According to the embodiment, the performance of the semiconductor device can be improved.

DETAILED DESCRIPTION

Below, the embodiments will be explained in detail based on the drawings. Also, in all drawings for explaining the embodiments, a same reference sign will be given to a member having a same function, and repeated explanation thereon will be omitted. Further, in the embodiments below, explanation on same or similar portions will not be repeated in principle except when it is particularly required.

Also, the symbols "−" and "+" express the relative concentration of the impurities whose conduction type is N-type or P-type, and, in the N-type impurities for example, the impurities concentration becomes higher in the order of "N$^-$", "N", "N$^+$". However, there is also a case the conduction type of each semiconductor layer is called as the N-type or P-type regardless of the impurities concentration. More specifically, there is a case that the semiconductor layers having various concentrations of "N$^-$", "N", "N$^+$" and the like are collectively called as the N-type layers, and the semiconductor layers having various concentrations of "P⁻", "P", "P⁺" and the like are collectively called as the P-type layers. In other words, there is a case the P⁺-type layer for example is called as the P-type layer.

First Embodiment

The diode that is a semiconductor device of the present embodiment includes a P-type anode layer formed in the main surface of a semiconductor substrate, an N-type cathode layer formed in the back surface of the semiconductor substrate, a back surface P-type layer formed in the back surface of the semiconductor substrate alongside the cathode layer, and a surface P-type layer formed in the main surface of the semiconductor substrate at the position right above the back surface P-type layer. Below, to improve the effect of hole injection to the diode at the time of the recovery operation and to thereby improve the performance of the diode by arrangement of the surface P-type layer which is the main feature of the present embodiment in the diode will be explained.

<On Structure of Semiconductor Device>

Figure 1:
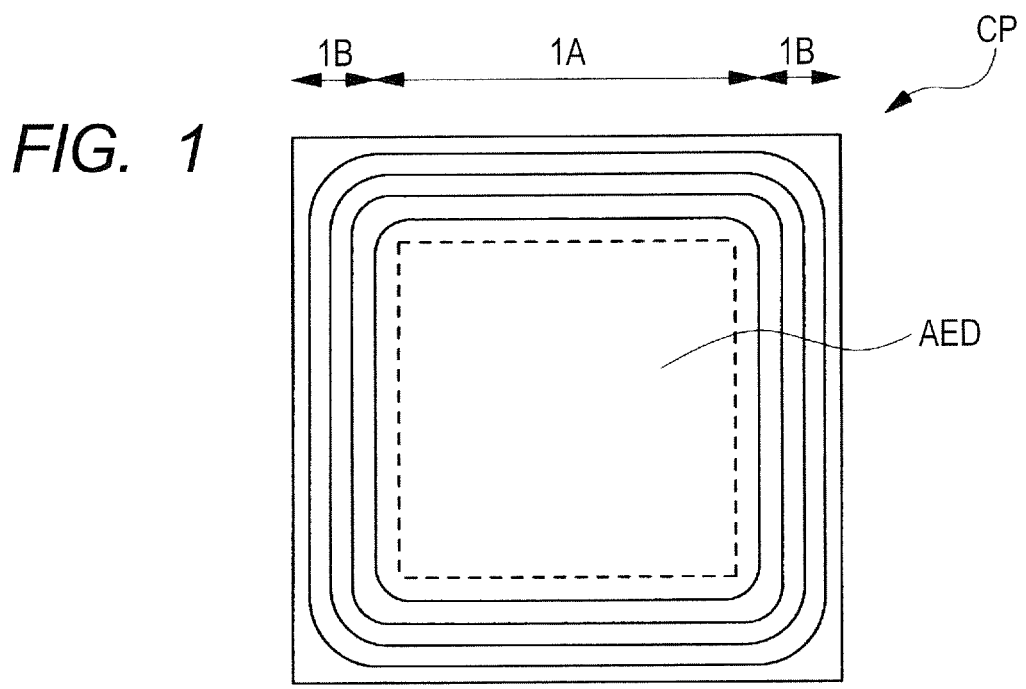
FIG. 1 is a plan view of a semiconductor device of the first embodiment.
Figure 2:
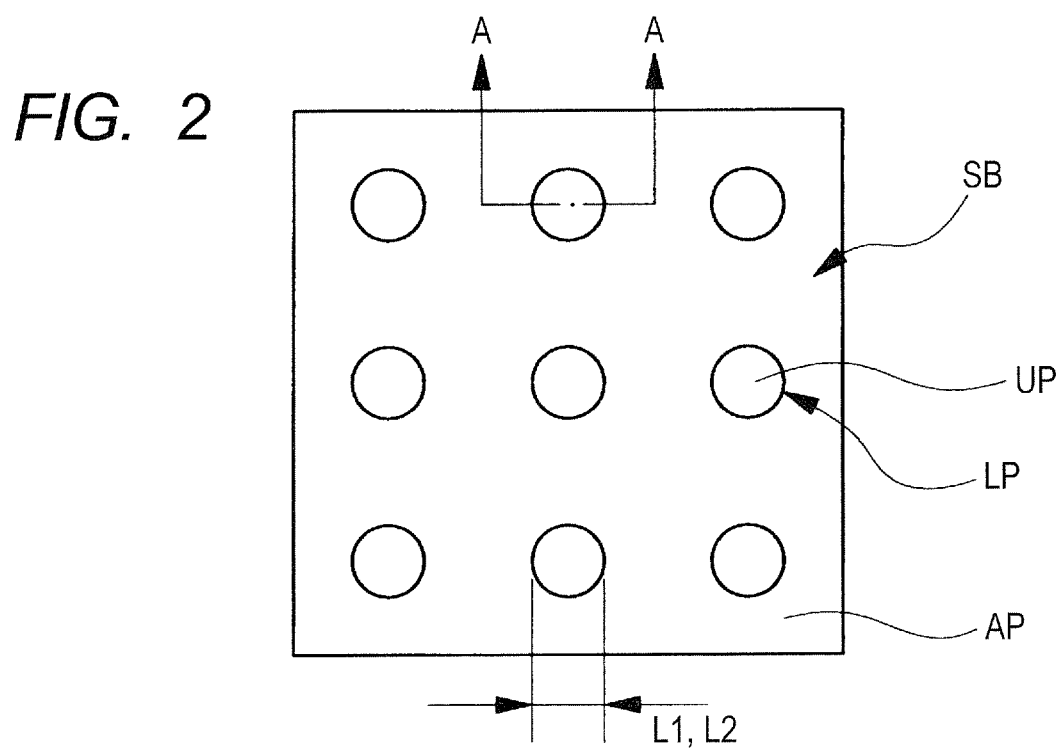
FIG. 2 is a plan view of the semiconductor device of the first embodiment.
Figure 3:
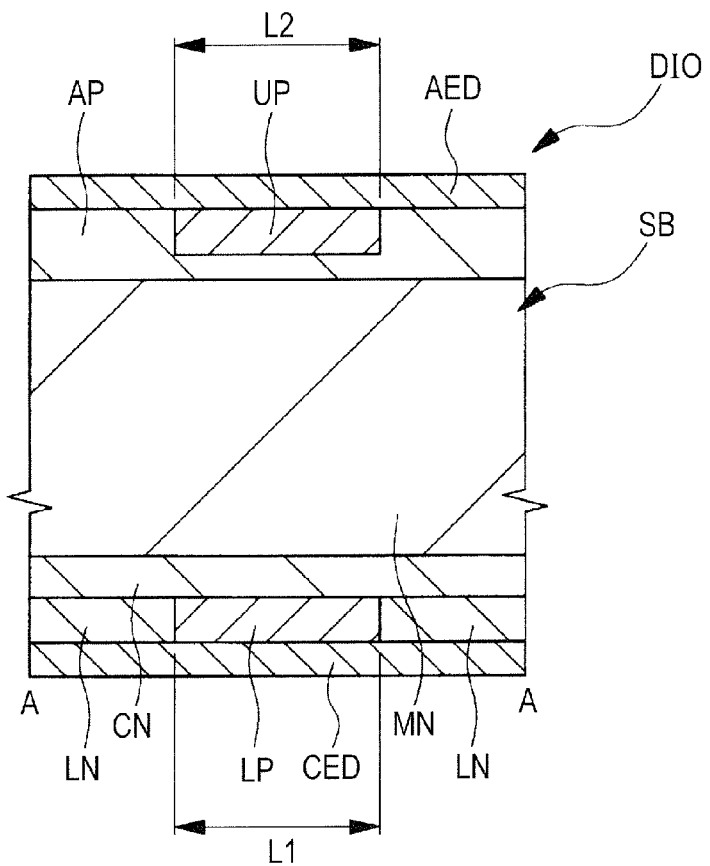
FIG. 3 is a cross-sectional view taken along the line A-A of FIG. 2.

The semiconductor device of the present embodiment will be explained referring to FIG. 1 to FIG. 3. FIG. 1 and FIG. 2 are plan views showing the semiconductor device of the present embodiment. FIG. 3 is a cross-sectional view taken along the line A-A of FIG. 2. Although a semiconductor chip is shown in FIG. 1, here, a pad (anode electrode) covering the main surface side of the semiconductor substrate is not illustrated. Also, in FIG. 2, a part of the upper surface of the semiconductor substrate forming the semiconductor chip described above is shown enlarged. FIG. 2 and FIG. 3 include a diode formed in an element region 1A shown in FIG. 1.

A semiconductor chip CP where a diode of the present embodiment is formed is shown in FIG. 1. As shown in FIG. 1, the semiconductor chip CP has a rectangular shape in the plan view. The element region 1A where a semiconductor element is formed exists in the center part in the plan view of the semiconductor chip CP, and a termination region 1B exists so as to surround the element region 1A. The termination region 1B is the peripheral part of the semiconductor chip CP, and has an annular structure of a rectangular shape in the plan view.

In the termination region 1B, a structure (a guard ring for example) for relaxing the electric field in the peripheral part of the semiconductor chip CP is formed. In the element region 1A, a diode is formed. In the element region 1A, on the main surface side of the semiconductor chip CP, an anode electrode AED that is an anode pad is formed.

In FIG. 1, an opening section of a passivation film (not illustrated) that covers a part of the upper surface of the semiconductor chip CP is shown in a broken line. More specifically, within the region surrounded by the broken line, the passivation film is not formed, and the anode electrode AED below the passivation film is exposed.

Also, in FIG. 2, a plan view of a part of the element region 1A described above is shown enlarged. In FIG. 2, illustration of the anode electrode over the semiconductor substrate is omitted, and the main surface of the semiconductor substrate SB and respective upper surfaces of plural semiconductor layers formed in the main surface are shown.

As shown in FIG. 2, in the upper surface of the semiconductor substrate SB, an anode P-type layer AP that is the P-type semiconductor layer is formed in a wide range. Also, in the main surface of the semiconductor substrate SB, surface P⁺-type layers UP which are plural P⁺-type semiconductor layers are disposed side by side. Here, the surface P⁺-type layers UP are disposed side by side by plural numbers in the first direction that is the direction along the main surface of the semiconductor substrate SB, and are disposed side by side by plural numbers also in the second direction that is the direction along the main surface of the semiconductor substrate SB and is orthogonal to the first direction. In other words, the surface P⁺-type layers UP are disposed side by side in plural numbers in a line and row form (matrix form). Each of the surface P⁺-type layers UP formed by plural numbers has a circular shape in the plan view.

Also, in FIG. 2, back surface P⁺-type layers LP which are plural P⁺-type semiconductor layers formed in the back surface of the semiconductor substrate SB are shown transmitting through the semiconductor substrate SB. However, here, because the surface P⁺-type layers UP and the back surface P⁺-type layers LP which have a shape same to each other in the plan view overlap each other, the profiles of these semiconductor layers are not illustrated discriminatingly. More specifically, the back surface P⁺-type layers LP are disposed side by side in plural numbers in a line and row form (matrix form) in the back surface of the semiconductor substrate SB, and each back surface P⁺-type layer LP has a circular shape in the plan view. In the present embodiment, respective profiles of the back surface P⁺-type layer LP and the surface P⁺-type layer UP overlap each other in the plan view.

Further, although an example of disposing the surface P⁺-type layers UP and the back surface P⁺-type layers LP in a matrix form was explained here, these P-type layers may be disposed so that the neighboring rows are shifted by a half period from each other. For example, the plural surface P⁺-type layers UP forming the second row that is neighboring in the second direction with respect to the first row formed of the plural surface P⁺-type layers UP arrayed in the first direction may be disposed so as to be neighboring in the second direction with respect to a middle region of the surface P⁺-type layers UP of the first row which are neighboring each other in the first direction. Also, the plural surface P⁺-type layers UP disposed in the main surface of the semiconductor substrate SB is not necessarily arrayed at equal intervals. Further, the plural back surface P⁺-type layers LP disposed in the back surface of the semiconductor substrate SB is not necessarily arrayed at equal intervals.

Also, the shape in the plan view of the surface P⁺-type layers UP and the back surface P⁺-type layers LP is not limited to a circular shape, and may be an elliptical shape, rectangular shape, square shape and the like. However, from the viewpoint of promoting the hole injection effect described below, it is preferable that respective shapes in the plan view of the surface P⁺-type layers UP and the back surface P⁺-type layers LP which overlap with each other in the plan view match with each other. The width L1 of the back surface P⁺-type layer LP and the width L2 of the surface P⁺-type layer UP shown in FIG. 2 and FIG. 3 are 200-400 μm. More specifically, when the width L1 of the back surface P⁺-type layer LP and the width L2 of the surface P⁺-type layer UP are 200-400 μm, sufficient hole injection effect can be secured. In other words, even when the area occupancy of the back surface P⁺-type layers LP in the back surface of the semiconductor substrate SB is less than 30%, sufficient hole injection effect can be secured.

For example, here, both of the width L1 of the back surface P⁺-type layer LP and the width L2 of the surface P⁺-type layer UP are 300 μm. Each of the width L1 and L2 is the length of the surface P⁺-type layer UP and the back surface P⁺-type layer LP in the direction along the main surface of the semiconductor substrate SB (may be hereinafter simply referred to as the lateral direction).

Also, in FIG. 3, a cross-sectional view taken along the line A-A of FIG. 2 is shown. As shown in FIG. 3, a diode DIO of the present embodiment is a rectifying element that makes the electric current flow between the main surface (surface) of the semiconductor substrate SB and the back surface on the opposite side of the main surface. The diode DIO includes an anode layer on the main surface side of the semiconductor substrate SB, includes a cathode layer on the back surface side of the semiconductor substrate SB, and includes the back surface P⁺-type layer LP and the surface P⁺-type layer UP.

The anode layer includes the anode P-type layer AP formed in the main surface of the semiconductor substrate SB, and the cathode layer includes a back surface N⁺-type layer LN formed in the back surface of the semiconductor substrate SB and an N-type layer CN that is formed over the back surface N⁺-type layer LN and contacts the upper surface of each of the back surface N⁺-type layer LN and the back surface P⁺-type layer LP. Between the anode P-type layer AP and the N-type layer CN, an N⁻-type layer MN is formed which contacts the anode P-type layer AP and the N-type layer CN. The formation depth of the surface P⁺-type layer UP is shallower than the formation depth of the anode P-type layer AP. In other words, a part of the anode P-type layer AP contacts the lower surface of the surface P⁺-type layer UP.

The back surface P⁺-type layer LP and the back surface N⁺-type layer LN are disposed so as to be adjacent to each other, and contact each other in the direction along the main surface of the semiconductor substrate SB. The formation depth from the back surface of the semiconductor substrate SB in the back surface P⁺-type layer LP is equal to the formation depth from the back surface of the semiconductor substrate SB in the back surface N⁺-type layer LN.

Here, the semiconductor substrate SB includes a first region and a second region which are arrayed adjacently to each other in the lateral direction, the surface P⁺-type layer UP and the back surface P⁺-type layer LP are not formed in the first region, and the surface P⁺-type layer UP and the back surface P⁺-type layer LP are formed in the second region. More specifically, the anode P-type layer AP, the N⁻-type layer MN, the N-type layer CN, and the back surface N⁺-type layer LN are formed in this order inside the semiconductor substrate SB of the first region from the main surface toward the back surface thereof. Also, inside the semiconductor substrate SB in the second region adjacent to and contacting the first region, the surface P⁺-type layer UP, the anode P-type layer AP, the N⁻-type layer MN, the N-type layer CN, and the back surface P⁺-type layer LP are formed in this order from the main surface toward the back surface thereof. More specifically, in the second region, the surface P⁺-type layer UP is formed right above the back surface P⁺-type layer LP. In other words, the surface P⁺-type layer UP terminates right above the terminal end part of the back surface P⁺-type layer LP.

Also, over the main surface of the semiconductor substrate SB, the anode electrode AED is formed which contacts the upper surface of each of the surface P⁺-type layer UP and the anode P-type layer AP. Further, on the back surface side of the semiconductor substrate SB, the cathode electrode AED is formed which contacts the lower surface of each of the back surface P⁺-type layer LP and the back surface N⁺-type layer LN. The anode electrode AED is physically and electrically coupled with each of the surface P⁺-type layer UP and the anode P-type layer AP, and a cathode electrode CED is physically and electrically coupled with each of the back surface P⁺-type layer LP and the back surface N⁺-type layer LN.

The diode DIO is a P-N junction diode formed by P-N junction of a P-type layer including the anode P-type layer AP and an N-type layer including the N⁻-type layer MN, the N-type layer CN, and the back surface N⁺-type layer LN. Also, when the N⁻-type layer MN is deemed an I-layer (Intrinsic Layer: intrinsic semiconductor layer), the diode DIO of the present embodiment can be said to form a PIN diode with the exception of the point of including the back surface P⁺-type layer LP and the surface P⁺-type layer UP.

The semiconductor substrate SB is formed of mono-crystal silicon (Si) for example. For the semiconductor substrate SB, the mono-crystal silicon formed by the CZ (Czochralski) method, the MCZ (Magnetic Field applied Czochralski) method, the FZ (Floating Zone) method, or the epitaxial growth method, and the like can be used. The concentration of the N-type impurities of the crystal that forms the semiconductor substrate SB is approximately $3.29 \times 10^{13}$ to $4.66 \times 10^{14}/cm^3$, and the resistance value of the semiconductor substrate SB is 10-140 Ωcm for example. The impurities concentration and the resistance value can be properly selected according to the usage of the semiconductor device. In the present embodiment, the impurities concentration of the semiconductor substrate SB means the impurities concentration of the N⁻-type layer MN.

The semiconductor substrate SB is made into a thin film by grinding, and the film thickness thereof is 40-200 μm for example. The breakdown voltage of the diode DIO depends on the crystal concentration (impurities concentration) of the semiconductor substrate SB. In other words, the breakdown voltage of the diode DIO depends on the crystal resistance coefficient. Therefore, when the breakdown voltage is assumed to be 600-2,000 V, it is preferable that the film thickness of the semiconductor substrate SB is 40-200 μm. The breakdown voltage of the diode DIO can be adjusted by the film thickness of the N⁻-type layer MN. In order to increase the breakdown voltage of the semiconductor device, the thickness of the N⁻-type layer MN is larger compared to the thickness of each of the surface P⁺-type layer UP, the anode P-type layer AP, the back surface P⁺-type layer LP, the N-type layer CN, and the back surface N⁺-type layer LN.

The anode P-type layer AP, the surface P⁺-type layer UP, and the back surface P⁺-type layer LP are the semiconductor layers to which the impurities of the P-type (B (boron) for example) are introduced. The concentration of the P-type impurities of the anode P-type layer AP is $1.0 \times 10^{16}$ to $1.0 \times 10^{18}/cm^3$ for example. The concentration of the P-type impurities of each of the surface P⁺-type layer UP and the back surface P⁺-type layer LP is $1.0 \times 10^{19}$ to $1.0 \times 10^{21}/cm^3$ for example.

The N⁻-type layer MN, the N-type layer CN, and the back surface N⁺-type layer LN are the semiconductor layers to which the impurities of the N-type (P (phosphor) or As (arsenic) for example) are introduced. The concentration of the N-type impurities of the N⁻-type layer MN is $3.29 \times 10^{13}$ to $4.66 \times 10^{14}/cm^3$ for example. The concentration of the N-type impurities of the N-type layer CN is $1.0 \times 10^{16}$ to $1.0 \times 10^{18}/cm^3$ for example. The concentration of the N-type impurities of the back surface N⁺-type layer LN is $1.0 \times 10^{18}$ to $1.0 \times 10^{21}/cm^3$ for example.

Therefore, in the diode DIO, the impurities concentration of the surface P⁺-type layer UP and the back surface P⁺-type layer LP is higher than that of the anode P-type layer AP. In the diode DIO, the impurities concentration of the back surface $N^+$-type layer LN is higher than that of the $N^-$-type layer MN and the N-type layer CN, and the impurities concentration of the N-type layer CN is higher than that of the $N^-$-type layer MN. Although the surface $P^+$-type layer UP and the back surface $P^+$-type layer LP have the impurities concentration similar to each other, here, the surface $P^+$-type layer UP has higher impurities concentration compared to the back surface $P^+$-type layer LP.

As the material used for the anode electrode AED, Al, AlSi (Si content is 0.5%-1.5%), AlCu, or AlSiCu can be cited for example. Particularly, from the viewpoint of preventing a phenomenon that aluminum is diffused into the semiconductor substrate SB (Al spike), it is preferable to use AlSi. The cathode electrode CED has a laminated structure for example in which plural metal films are laminated, and includes a laminated layer in which Ni/Ti/Ni/Au are laminated in this order from the back surface side of the semiconductor substrate SB, or a laminated layer in which AlSi/Ti/Ni/Au are laminated in this order from the back surface side of the semiconductor substrate SB for example.

<On Operation and Effect of Semiconductor Device>

Figure 7:
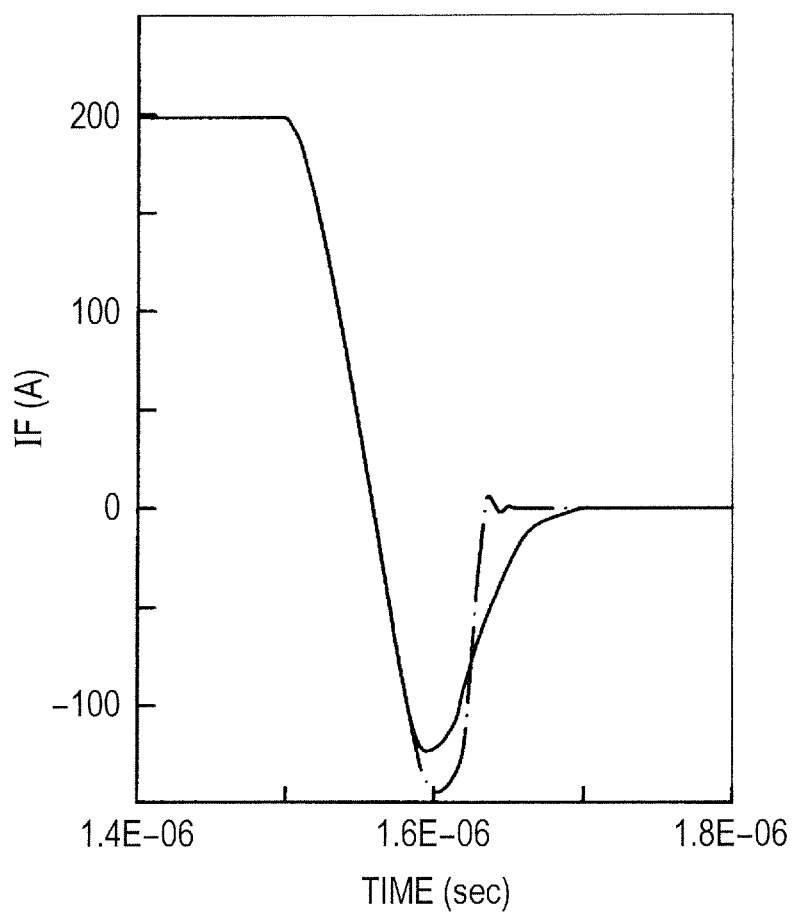
FIG. 7 is a graph explaining the effect of a semiconductor device of a comparative example.
Figure 8:
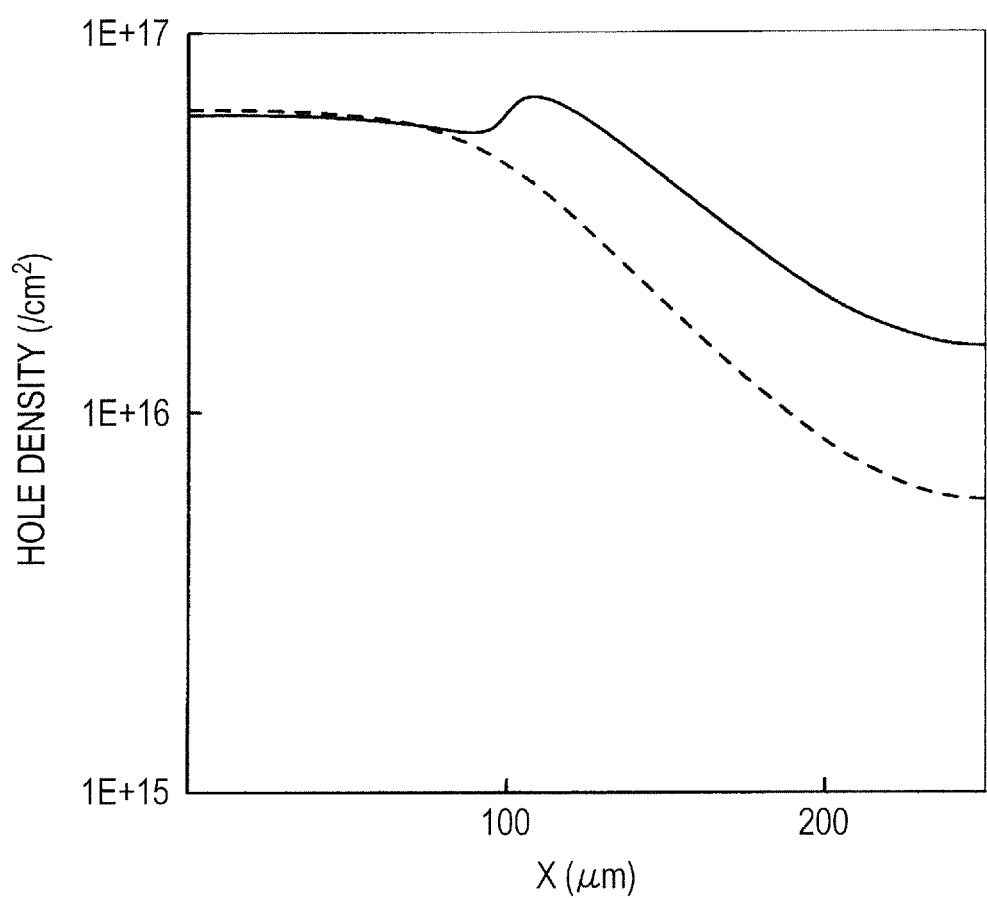
FIG. 8 is a graph explaining the effect of the semiconductor devices which are the comparative example and the first embodiment.
Figure 26:
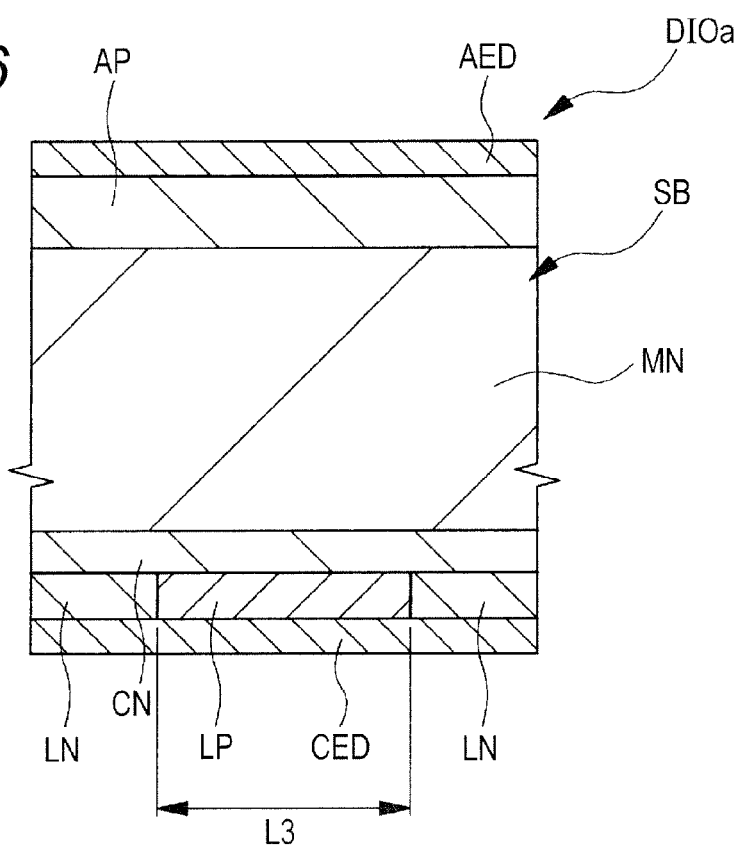
FIG. 26 is a cross-sectional view of a semiconductor device of a comparative example.
Figure 27:
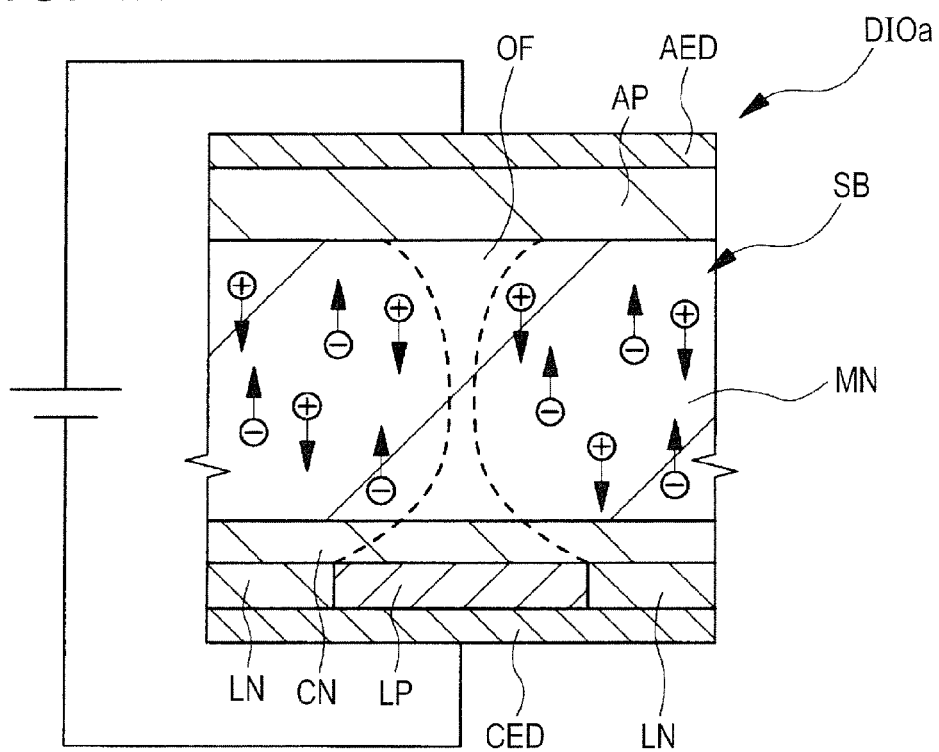
FIG. 27 is a cross-sectional view explaining an operation of a semiconductor device of a comparative example.
Figure 28:
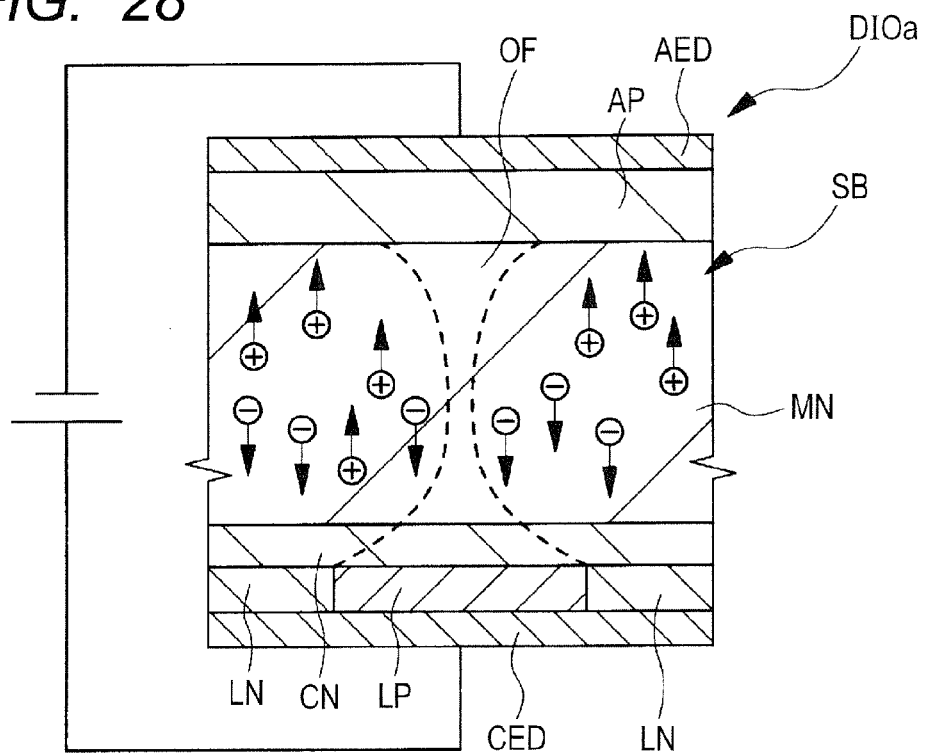
FIG. 28 is a cross-sectional view explaining an operation of a semiconductor device of a comparative example.
Figure 29:
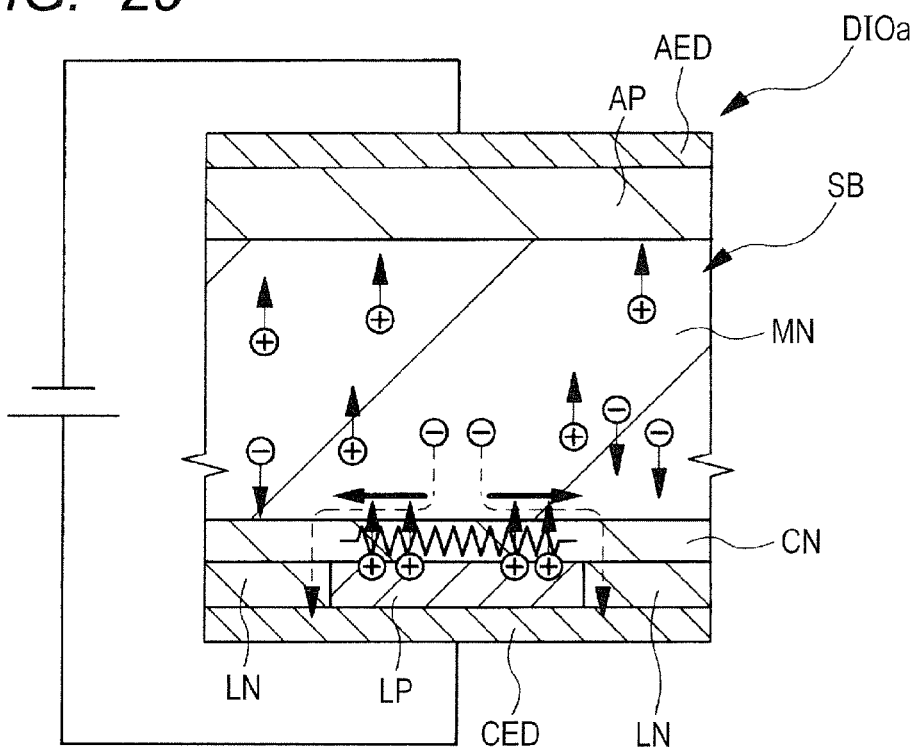
FIG. 29 is a cross-sectional view explaining an operation of a semiconductor device of a comparative example.

Below, using FIG. 26 to FIG. 29, FIG. 7 and FIG. 8, the structure and operation of a diode that is a semiconductor device of the comparative example and the problematic point of the semiconductor device of the comparative example will be explained. FIG. 26 is a cross-sectional view of a diode that is a semiconductor device of the comparative example. FIG. 27 to FIG. 29 are cross-sectional views explaining an operation of the diode that is the semiconductor device of the comparative example. FIG. 7 is a graph explaining the effect of the semiconductor device of the comparative example. FIG. 8 is a graph explaining the effect of the semiconductor device of the present embodiment and the comparative example.

As shown in FIG. 26, a diode DIOa of the comparative example is a P-N junction diode having a structure similar to that of the diode DIO of the present embodiment (refer to FIG. 3) with the exception of the point that the surface $P^+$-type layer UP (refer to FIG. 3) is not formed and the point that the width L3 of the back surface $P^+$-type layer LP is larger than the width L1 of the back surface $P^+$-type layer LP of the diode DIO of the present embodiment shown in FIG. 3. More specifically, as shown in FIG. 26, the anode P-type layer AP is formed over the entire surface of the main surface of the semiconductor substrate SB, and the P-type layer is not formed which is the semiconductor layer contacting the anode P-type layer AP and has the P-type impurities concentration higher than that of the anode P-type layer AP.

When a forward voltage is applied, the diode DIOa of the comparative example operates as shown in FIG. 27. More specifically, when a forward voltage is applied, the diode DIOa becomes the ON-state, the electrons move from the back surface $N^+$-type layer LN side to the anode P-type layer AP side and the holes move from the anode P-type layer AP side to the back surface $N^+$-type layer LN side inside the $N^-$-type layer MN. Thus, the electric current flows from the anode electrode AED side to the cathode electrode CED side.

Figure 4:
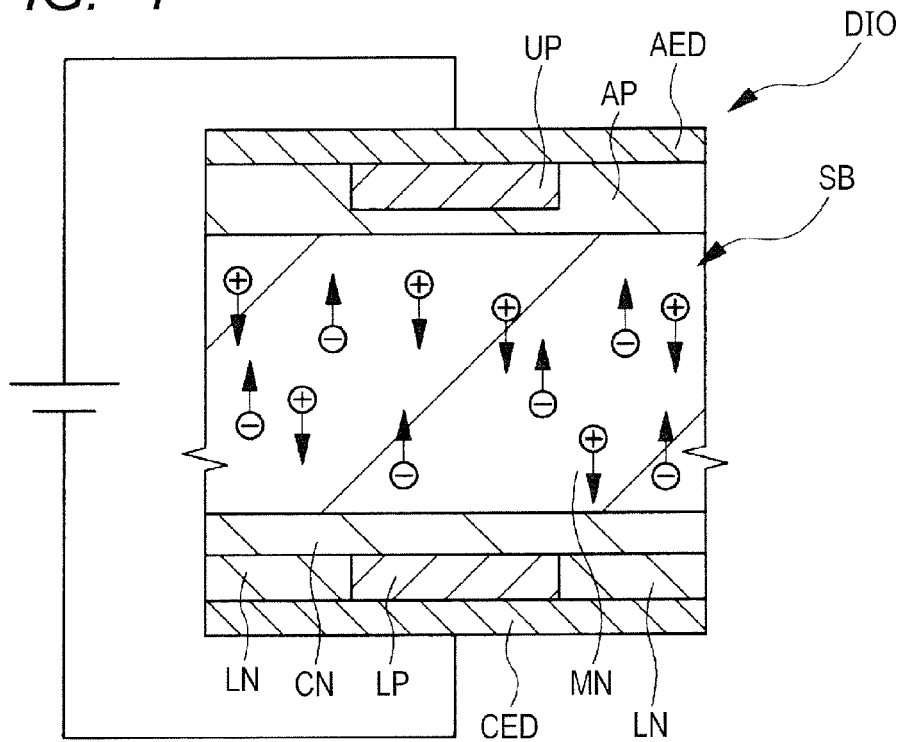
FIG. 4 is a cross-sectional view explaining an operation of the semiconductor device of the first embodiment.

In FIG. 7, the graph of the electric current flowing through the diode DIOa of the comparative example is shown in the solid line. The graph of the electric current of the time when the forward voltage is applied as described above and the forward electric current flows is shown in a part of FIG. 7. More specifically, at the time of the ON-operation as shown in FIG. 4, as shown in the range of $1.4 \times 10^{-6}$ to $1.5 \times 10^{-6}$ sec in the graph of the solid line of FIG. 7, a constant forward electric current flows at 200 A for example. Also, in FIG. 7, the graph shown in the single dot chain line shows the electric current characteristics of the diode that has not the back surface $P^+$-type layer LP.

Here, as shown in the broken line in FIG. 27, in the semiconductor substrate SB right above the back surface $P^+$-type layer LP, there is a region where the carrier concentration is low compared to other regions during operation of the diode DIOa (hereinafter referred to as the off region OF). The off region OF is a region that does not function as a diode and becomes the OFF-state because the back surface $N^+$-type layer LN forming the diode DIOa is not formed right below thereof and the back surface $P^+$-type layer LP is formed. When the off region OF exists, because the internal resistance of the diode increases, the conduct loss increases at the time of operation of the diode DIOa. Therefore, the forward voltage drop increases in the diode DIOa.

The broken line shown in the drawing shows a region where the conductivity modulation occurs, and the diode DIOa is in ON-operation within the semiconductor substrate SB in the side of the off region OF. Also, in the off region OF, the carrier concentration is not 0, but is in a state of extremely low compared to the ON-operation part.

The conduct modulation region shown in the broken line which is the boundary of the ON-operation region and the off region OF widens in the lateral direction in the vicinity of each of the back surface and the main surface of the semiconductor substrate SB. On the other hand, the off region OF narrows in the lateral direction in the center part in the thickness direction of the $N^-$-type layer MN. This is because the ON-operation region is widened by approximately 150 µm in the lateral direction.

FIG. 28 shows the movement of the electrons and the holes of the time immediately after application of the backward bias to the diode DIOa of the comparative example. When the backward bias is applied to the diode DIOa of the comparative example, the electrons inside the $N^-$-type layer MN move toward the direction of being discharged to the cathode electrode CED side, and the holes inside the $N^-$-type layer MN move toward the direction of being discharged to the anode electrode AED side. In other words, when it is switched to the backward bias, as shown in the graph of the time immediately after $1.5 \times 10^{-6}$ sec out of the graph of the solid line of FIG. 7, the electric current value drops, and the electric current flows backward temporarily.

FIG. 29 shows the movement of the electrons and the holes of the time after the state shown in FIG. 28 until the electric current flowing through the diode DIOa becomes constant at approximately 0 A which is the time of the recovery operation. More specifically, at the time of the recovery operation, the electric current flows as shown in the graph of the time after $1.6 \times 10^{-6}$ sec until the electric current value becomes constant at 0 A out of the graph of the solid line of FIG. 7. When the backward bias is applied, the electrons are injected from the electric source to the anode electrode AED, and the holes are injected from the electric source to the cathode electrode CED.

Thus, the carriers inside the semiconductor substrate SB reduce by recombination of the carriers inside the semiconductor substrate SB and discharge to the anode electrode AED or the cathode electrode CED. Thereby, after switching shown in FIG. 28, the absolute value of the electric current having been flown backward gradually reduces, and the electric current becomes 0 thereafter. The recovery operation means the operation of the diode DIOa in the process after the backward electric current flows temporarily by switching from the forward bias to the backward bias until the electric current value becomes constant at 0 A.

After the voltage applied to the diode DIOa is switched to the backward bias and the electrons and the holes start to move as explained using FIG. 28, the electrons go through the N-type layer CN and the back surface $N^+$-type layer LN successively and reach the cathode electrode CED as shown in FIG. 29. Here, at the time of the recovery operation, the electrons do not pass through the back surface $P^+$-type layer LP but flow to the back surface $N^+$-type layer LN where the potential barrier is small for the electrons.

Here, the electrons having been present right above the back surface $P^+$-type layer LP move to the lateral direction inside the N-type layer CN right above the back surface $P^+$-type layer LP. Thus, the voltage drop (hereinafter referred to as IR-DROP) occurs by the electron current and the resistance component of the N-type layer CN. In FIG. 29, the moving route of the electrons which are a part of the electrons inside the $N^-$-type layer MN and cause IR-DROP against the N-type layer CN is shown in the broken line. Also, IR-DROP caused by movement of a part of the electrons in the boundary of the $N^-$-type layer MN and the N-type layer CN is shown by the arrows of the bold solid line.

Because the back surface $N^+$-type layer LN and the back surface $P^+$-type layer LP are electrically short-circuited through the cathode electrode CED, when IR-DROP exceeds 0.7 V (built-in voltage), the P-N junction between the back surface $N^+$-type layer LN and the back surface $P^+$-type layer LP or between the N-type layer CN and the back surface $P^+$-type layer LP is transiently joined. As a result, the holes are injected from the cathode electrode CED to the back surface $P^+$-type layer LP, and a plasma region is formed in the vicinity of the cathode. In other words, because IR-DROP is caused, the holes are forcibly injected from the back surface $P^+$-type layer LP, and the hole concentration becomes high.

In the diode DIOa of the comparative example, because the back surface $P^+$-type layer LP is arranged, at the time of the recovery operation, holes are injected from the cathode electrode CED to the back surface $P^+$-type layer LP, and a plasma region is formed in the vicinity of the cathode. Thus, because the depletion layer stops at the plasma region, the back surface electric field can be relaxed. Also, because the holes are injected from the back surface $P^+$-type layer LP and the electric current flows, oscillation (ringing) of the electric current can be suppressed. In other words, at the time of the recovery operation, implementation of soft recovery can be achieved. Also, there is a correlation between the area occupancy of the back surface $P^+$-type layer LP with respect to the back surface entire area of the semiconductor substrate SB and the tail electric current component at the time of the recovery operation, and the effect of reducing the excessive tail electric current component caused by reduction of the electron discharge resistance can be secured by reducing the area occupancy of the back surface $P^+$-type layer LP.

Here, the effects of these electric field relaxation effect, electric current oscillation suppression effect, soft recovery implementation effect, tail electric current component reduction effect, and the like are collectively referred to as a hole injection effect. More specifically, the diode DIOa of the comparative example is a back surface hole injection type diode, and the hole injection effect is secured at the time of the recovery operation by forming the back surface $P^+$-type layer LP.

The tail electric current referred to here means that the negative electric current having a low absolute value flows for a long time immediately before the electric current changes from positive to negative according to the lapse of time and returns to 0 A thereafter as shown in the graph of the solid line of FIG. 7.

When the diode is switched from the ON-state to the OFF-state, it is ideal that the electric current becomes 0 A instantaneously and the electric current is stable at 0 A thereafter. However, practically, because the electric current flows backward when the carriers inside the semiconductor substrate are discharged, a loss (switching loss) is generated. The loss increases as the absolute value of the negative electric current is larger, and increases as the time when the negative electric current flows is longer. Therefore, if the time when the tail electric current flows becomes longer, the loss also increases.

The loss described above referred to here means the electric loss or thermal loss and the like generated by that the electric current flows backward once when the diode is switched to the OFF-state as shown in the graph of the solid line of FIG. 7.

Ringing means a phenomenon that the electric current oscillates in the vicinity of 0 A when the electric current becomes 0 A after the backward voltage is applied to the diode and the negative electric current flows as shown in the graph of the single dot chain line of FIG. 7. In a diode in which the back surface $P^+$-type layer is not arranged and the $N^+$-type layer is formed over the entire back surface of the semiconductor substrate, because the hole injection effect cannot be secured, the ringing is caused when the backward electric current flowing after switching to the backward bias increases, the backward electric current further reduces, and the electric current becomes 0 A as shown in the graph of the single dot chain line. In other words, the ringing is caused by that the carriers rapidly pass through to the anode side or the cathode side at the time of the recovery operation.

When the ringing is caused, such problems occur that the noise and the electromagnetic wave are generated in the semiconductor device and that the aged deterioration of the semiconductor device is accelerated. In the diode having the characteristics of the graph shown in the single dot chain line and not having the back surface $P^+$-type layer LP, it can be thought of to increase the film thickness of the semiconductor substrate in order to prevent the ringing. However, when the film thickness of the semiconductor substrate is increased, because the internal resistance of the diode increases, the forward drop voltage at the time of operation of the diode increases, and the conduct loss increases.

On the other hand, in the diode DIOa of the comparative example, because the back surface $P^+$-type layer LP is arranged, soft recovery can be implemented and generation of the ringing can be prevented. In other words, the hole injection effect described above can be secured. However, in the diode DIOa of the comparative example, there is such problematic point as described below. More specifically, because a diode of the back surface hole injection type includes the back surface $P^+$-type layer LP inside the cathode layer on the back surface side of the semiconductor substrate SB, due to the relation of the diffusing distance in the lateral direction of the electrons injected to the back surface $N^+$-type layer at the time of ON-operation (refer to FIG. 27), the region right above the back surface $P^+$-type layer LP hardly functions effectively as a diode and becomes a non-effective region.

To be more specific, the diode DIOa including the back surface $P^+$-type layer LP shown in FIG. 27 has a problem that, because the off region OF where the diode DIOa is not operated is generated right above the back surface $P^+$-type layer LP, the forward drop voltage VF of the diode DIOa increases. Also, with respect to the back surface $P^+$-type layer LP, the potential barrier is small for the holes inside the semiconductor substrate SB, the back surface $P^+$-type layer LP becomes a shortcut to the cathode electrode CED, and therefore the forward drop voltage VF of the diode DIOa thereby increases.

Further, because the back surface $P^+$-type layer LP becomes a carrier barrier layer for the electrons inside the semiconductor substrate SB, it is delayed for the electrons to pass through to the cathode electrode CED side, and the tail component of the electric current (tail electric current component) at the time of the recovery operation increases. Therefore, there is a problem that, when the diode DIOa is made the OFF-state, the loss generated until the electric current value becomes 0 A is large.

In the semiconductor device using such diode DIOa of the comparative example, it can be thought of that, by making the semiconductor wafer thin to the film thickness sufficient to maintain the required breakdown voltage and securing the area occupancy of the back surface $P^+$-type layer LP with respect to the entire area of the back surface of the semiconductor substrate SB a constant value or more (20% or more for example), the forward voltage drop is reduced while securing the hole injection effect. The area occupancy of the back surface $P^+$-type layer LP is a rate calculated by dividing the total area of the area of plural back surface $P^+$-type layers LP by the entire area of the back surface of the semiconductor chip where the diode DIOa is formed.

Here, in order to reduce the forward voltage drop of the back surface hole injection type diode and to achieve miniaturization and high performance of the diode, to reduce the area occupancy of the back surface $P^+$-type layer becomes an object. Although it is preferable that the area occupancy of the back surface $P^+$-type layer is required minimum in a range sufficient hole injection effect can be secured, in the diode of the comparative example described above, it is hard to reduce the area occupancy of the back surface $P^+$-type layer. Below, the reason to reduce the area occupancy of the back surface $P^+$-type layer is hard will be explained using FIG. 8 that is the graph of the result of simulating the hole distribution at the time of the ON-operation.

In FIG. 8, the graph of the simulation result of the diode of the comparative example is shown in the broken line, and the graph of the simulation result of the diode of the present embodiment is shown in the solid line. The vertical axis of FIG. 8 expresses the distribution density of the hole inside the semiconductor substrate, and the horizontal axis expresses the distance X from one end in the direction along the main surface of the semiconductor substrate to the center of the diode cell when one diode cell including one back surface $N^+$-type layer is divided into a half. In other words, FIG. 8 corresponds to the position from one end of the diode to the center part of the back surface $N^+$-type layer shown in FIG. 3 or FIG. 26 in the same direction. In FIG. 8, the region of 0-100 μm of the distance X of the horizontal axis corresponds to the back surface $N^+$-type layer, and the region of 100 μm-250 μm corresponds to the back surface $P^+$-type layer.

As shown in the graph of the broken line of FIG. 8, in the diode DIOa of the comparative example (refer to FIG. 27), the carrier concentration drops by approximately single digit at the position of approximately 150 μm to the inward direction of the back surface $P^+$-type layer from the reference of the boundary of the back surface $N^+$-type layer and the back surface $P^+$-type layer contacting the cathode electrode (the position of 100 μm of the horizontal axis). In other words, it is known that the structure of the diode DIOa of the comparative example is a structure in which the carrier concentration (electron/hole concentration) that becomes a trigger of the back surface hole injection is low and sufficient hole injection effect cannot be secured.

More specifically, in order to reduce the area occupancy of the back surface $P^+$-type layer while securing sufficient hole injection effect, it is necessary to increase the amount of the carriers supplied into the semiconductor substrate and to increase the carrier concentration. In the diode DIOa of the comparative example, although a large hole injection amount can be secured in the vicinity of the end of the back surface $P^+$-type layer, in the vicinity of the center part of the back surface $P^+$-type layer in the lateral direction, the holes can hardly be injected as shown in FIG. 8.

Therefore, when the p-type layer (back surface $P^+$-type layer) with high concentration is formed only in the back surface as the comparative example, in order to secure sufficient hole injection effect, the area occupancy of the back surface $P^+$-type layer in the back surface of the semiconductor substrate is necessary by a certain level or more. When the area occupancy of the back surface $P^+$-type layer increases, the off region OF (refer to FIG. 27) increases, and the internal resistance of the diode becomes large. Therefore, in the diode of the comparative example, when it is emphasized to secure sufficient hole injection effect, it is hard to reduce the area occupancy of the back surface $P^+$-type layer in order to prevent the forward voltage drop of the diode.

As described above, to reduce the forward voltage drop by reducing the area occupancy of the back surface $P^+$-type layer of the diode and to secure the hole injection effect such as reduction of excessive tail electric current component by reduction of the electron discharge resistance at the time of the recovery operation are in the relationship of trade off. For example, when the area occupancy of the back surface $P^+$-type layer is reduced, sufficient hole injection effect cannot be secured, and therefore it is necessary to increase the film thickness of the semiconductor substrate and to implement the soft recovery.

Also, because the actual carrier distribution is as shown in FIG. 8, the largest hole injection amount is secured in the vicinity of the end of the back surface $P^+$-type layer. More specifically, the highest hole injection effect cannot be secured in the center part of the width of the back surface $P^+$-type layer, and it cannot be said that higher hole injection effect is secured as the width of the back surface $P^+$-type layer is longer. Therefore, by optimization into the structure of securing the required minimum width of the back surface $P^+$-type layer, reduction of the forward voltage drop of the diode, miniaturization of the diode, and so on can be achieved.

Figure 5:
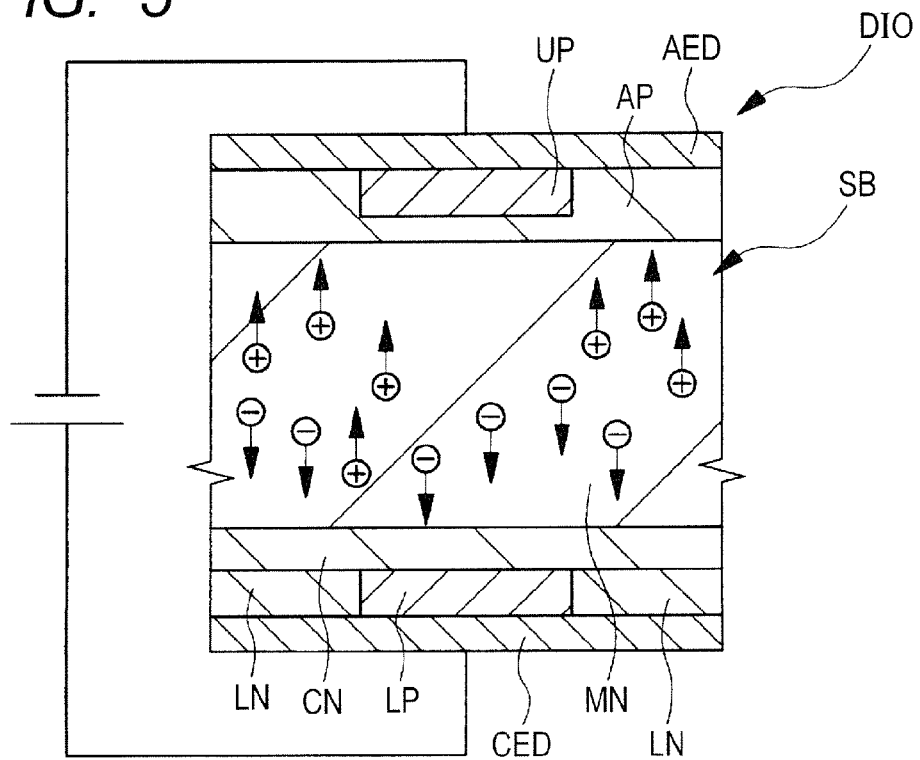
FIG. 5 is a cross-sectional view explaining an operation of the semiconductor device of the first embodiment.
Figure 6:
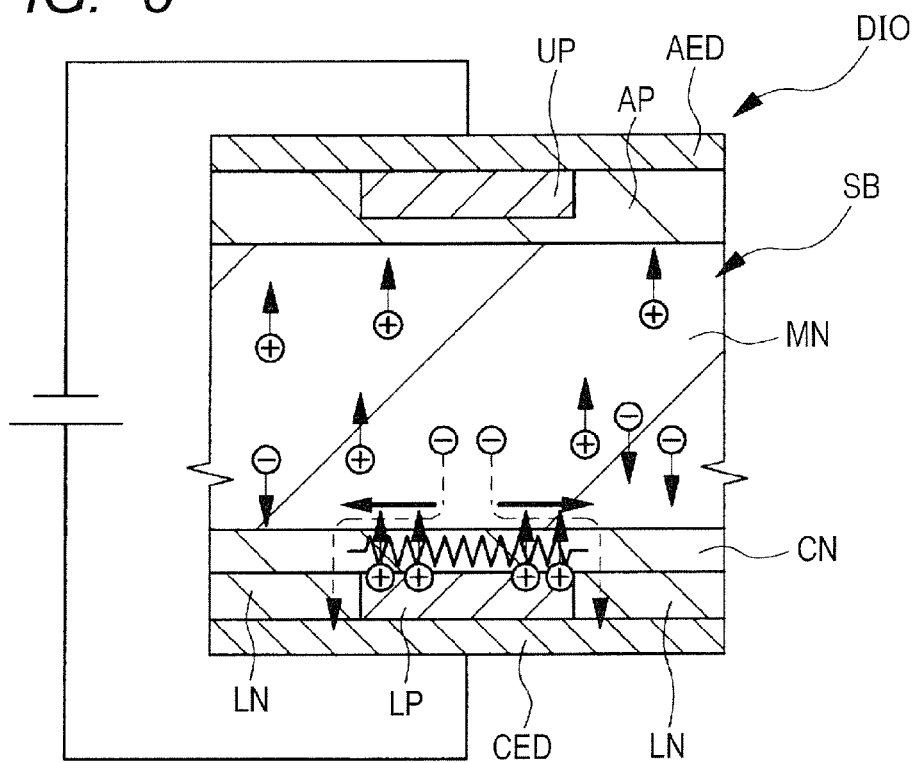
FIG. 6 is a cross-sectional view explaining an operation of the semiconductor device of the first embodiment.
Figure 9:
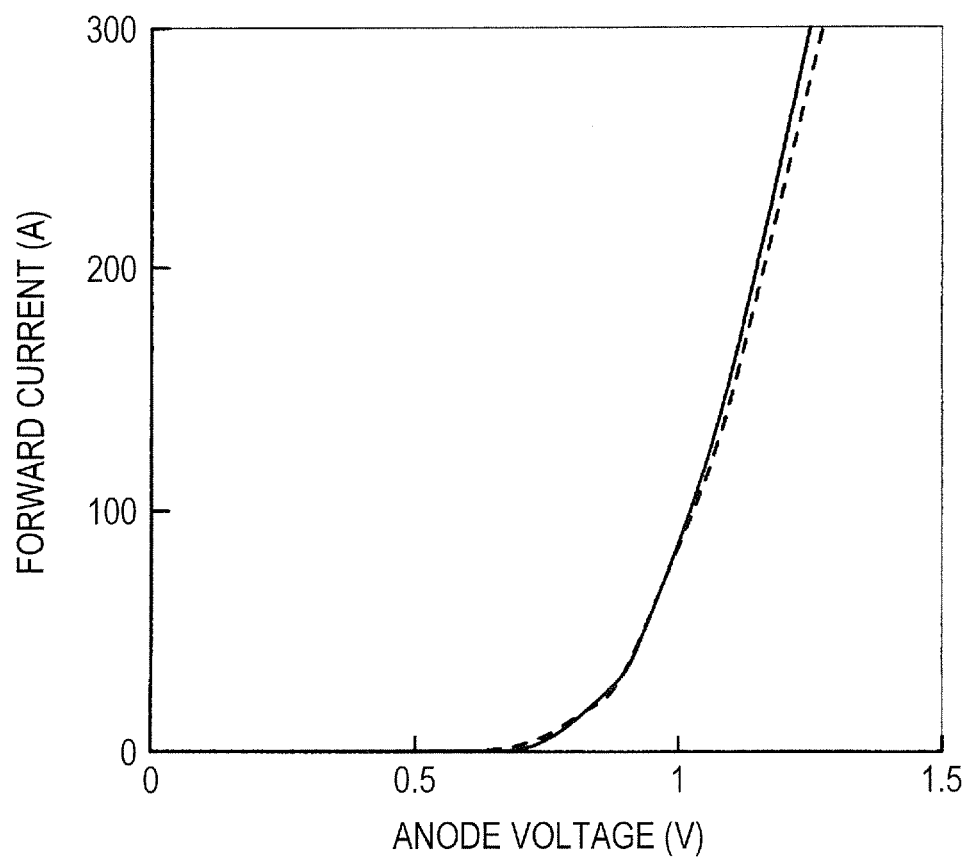
FIG. 9 is a graph explaining the effect of the semiconductor device of the first embodiment.

Next, the operation of the diode that is the semiconductor device of the present embodiment will be explained using FIG. 4 to FIG. 6, and the operation and the effect of the semiconductor device of the present embodiment will be explained using the graphs shown in FIG. 8 and FIG. 9. FIG. 4 shows a cross section of the diode DIO of a case the forward voltage is applied. FIG. 5 and FIG. 6 show a cross section of the diode DIO of a case the backward voltage is applied. FIG. 4 to FIG. 6 show the movement of the holes and the electrons inside the semiconductor substrate SB. FIG. 8 and FIG. 9 are graphs explaining the effect of the semiconductor device of the present embodiment.

In the semiconductor device of the present embodiment, the surface $P^+$-type layer UP having the impurities concentration higher than that of the anode P-type layer AP is formed in the main surface of the semiconductor substrate SB right above the back surface $P^+$-type layer LP as shown in FIG. 3 unlike the comparative example described above. Although the OFF-region inside the semiconductor substrate is not illustrated in FIG. 4 to FIG. 6, in the present embodiment, it is considered that the OFF-region is formed in the range narrower compared to the comparative example described above (refer to FIG. 27 to FIG. 29).

Next, the operation of the diode DIO at the time of the forward bias will be explained using FIG. 4. FIG. 4 shows the movement of the electrons and the holes inside the semiconductor substrate SB in the case a positive voltage is applied to the anode electrode AED of the diode DIO and a negative voltage is applied to the cathode electrode CED which is the case a forward voltage is applied to the diode DIO. At this time, the holes are injected from the anode electrode AED side into the semiconductor substrate SB, and the electrons are injected from the cathode electrode CED side into the semiconductor substrate SB. When the forward bias is applied thus, the diode DIO becomes the ON-state, the electrons move from the back surface $N^+$-type layer LN side to the anode P-type layer AP side and the holes move from the anode P-type layer AP side to the back surface $N^+$-type layer LN side inside the $N^-$-type layer MN. Thus, the electric current flows from the anode electrode AED side to the cathode electrode CED side.

At this time, the holes pass through the $N^-$-type layer MN and the N-type layer CN in this order from the anode P-type layer AP, and thereafter reaches the back surface $N^+$-type layer LN. Also, the electrons pass through the N-type layer CN and the $N^-$-type layer MN in this order from the back surface $N^+$-type layer LN, and thereafter reaches the anode P-type layer AP. At the time of the ON-operation as shown in FIG. 4, a constant forward electric current flows at 200 A for example.

Next, the operation of the diode DIO at the time of the backward bias will be explained using FIG. 5 and FIG. 6. FIG. 5 and FIG. 6 show the movement of the electrons and the holes inside the semiconductor substrate SB in the case a negative voltage is applied to the anode electrode AED of the diode DIO and a positive voltage is applied to the cathode electrode CED which is the case a backward voltage is applied.

FIG. 5 shows the movement of the electrons and the holes immediately after the backward bias is applied. As shown in FIG. 5, at the time of applying the backward bias, the electrons inside the $N^-$-type layer MN move toward the direction of being discharged to the cathode electrode CED side, and the holes inside the $N^-$-type layer MN move toward the direction of being discharged to the anode electrode AED side. This means that the electric current flows from the cathode electrode CED side to the anode electrode AED side temporarily in the diode DIO immediately after being switched to the backward bias. In other words, when it is switched to the backward bias, the electric current value drops, and the electric current flows backward temporarily. Thereafter, after going through the recovery operation shown in FIG. 6, the depletion layer expands inside the $N^-$-type layer MN to a width determined by the impurities concentration of the $N^-$-type layer MN, and the electric current flowing through the diode DIO becomes approximately 0 A.

FIG. 6 shows the movement of the electrons and the holes of the time after the state shown in FIG. 5 until the electric current flowing through diode DIO becomes constant at approximately 0 A which is the time of the recovery operation. At the time of applying the backward bias, the electrons are injected from the electric source to the anode electrode AED, and the holes are injected from the electric source to the cathode electrode CED. Thereafter, the carriers inside the semiconductor substrate SB are discharged to the anode electrode AED or the cathode electrode CED, the carriers inside the semiconductor substrate SB reduce, thereby, after the time of switching shown in FIG. 5, the absolute value of the electric current flowing backward gradually reduces, and the electric current becomes 0 A thereafter.

After the voltage applied to the diode DIO is switched to the backward bias and the electrons and the holes start to move as explained using FIG. 5, as shown in FIG. 6, the electrons pass through the N-type layer CN and the $N^+$-type layer LN in this order, and reach the cathode electrode CED. Here, at the time of the recovery operation, the electrons do not pass through the back surface $P^+$-type layer LP, but flow to the back surface $N^+$-type layer LN where the electrons can easily flow.

At this time, IR-DROP is caused by the electron current and the resistance component against the N-type layer CN. In FIG. 6, the moving route of the electrons which are a part of the electrons inside the $N^-$-type layer MN and cause IR-DROP between the N-type layer CN is shown in the broken line. Also, IR-DROP caused by movement of a part of the electrons in the boundary of the $N^-$-type layer MN and the N-type layer CN is shown by the arrows of the bold solid line.

Because the back surface $N^+$-type layer LN and the back surface $P^+$-type layer LP are electrically short-circuited through the cathode electrode CED, when IR-DROP exceeds 0.7 V (built-in voltage), the P-N junction between the back surface $N^+$-type layer LN and the back surface $P^+$-type layer LP or between the N-type layer CN and the back surface $P^+$-type layer LP is transiently joined. As a result, the holes are injected from the cathode electrode CED to the back surface $P^+$-type layer LP, and a plasma region is formed in the vicinity of the cathode.

Thus, because the depletion layer stops at the plasma region, the back surface electric field can be relaxed, and oscillation (ringing) of the electric current can be suppressed. In other words, at the time of the recovery operation, implementation of soft recovery can be achieved. Also, by improving the effect of the hole injection from the back surface, the area occupancy of the back surface $P^+$-type layer LP can be reduced, and therefore the effect of reducing the excessive tail electric current component caused by reduction of the electron discharge resistance of the time of the recovery operation can be secured. In the semiconductor device of the comparative example described above, it is hard to secure sufficient hole injection effect and to set the area occupancy of the back surface $P^+$-type layer LP to less than 30%. However, in the semiconductor device of the present embodiment, because the effect of the hole injection from the back surface can be improved, it is possible to secure sufficient hole injection effect and to set the area occupancy of the back surface $P^+$-type layer LP to less than 30%.

As described above, the diode DIO of the present embodiment is the back surface hole injection type diode, and secures the hole injection effect more effectively by forming the back surface $P^+$-type layer LP and forming the surface $P^+$-type layer UP.

From the viewpoint of improving the effect of the hole injection from the back surface, it is preferable that the back surface P$^+$-type layer LP and the surface P$^+$-type layer UP overlap with each other in a plan view as shown in FIG. 3. More specifically, because the surface P$^+$-type layer UP exists right above the end of the back surface P$^+$-type layer LP in the lateral direction, the hole injection effect can be improved.

Here, the effect of the semiconductor device of the present embodiment will be explained using FIG. 8 and FIG. 9.

The vertical axis shown in FIG. 9 expresses the electric current flowing through the diode, and the horizontal axis expresses the forward voltage applied to the anode. In FIG. 9, the electric current characteristic of the diode DIO of the present embodiment (refer to FIG. 4) is shown in the solid line, and the electric current characteristic of the diode DIOa of the comparative example described above (refer to FIG. 27) is shown in the broken line. The graph shown in FIG. 9 is the electric current characteristic at the time of the forward bias of the diode of the present embodiment and the comparative example. However, with respect to the diode of the present embodiment and the diode of the comparative example in FIG. 9, the electric current characteristic is measured in a state the area occupancy of the back surface P$^+$-type layer in the entire area of the back surface of the semiconductor substrate is equal for the both.

As shown in FIG. 9, between the diode of the present embodiment and the diode of the comparative example, there is little difference in the electric current characteristic at the time of applying the forward bias. In other words, even when the surface P$^+$-type layer UP is formed as the diode DIO of the present embodiment shown in FIG. 3, the characteristic at the time of the forward bias does not deteriorate.

From FIG. 9, it is known that, in the diode of the present embodiment, when the area occupancy of the back surface P$^+$-type layer in the entire area of the back surface of the semiconductor substrate is reduced, the OFF-region generated by arranging the back surface P$^+$-type layer can be narrowed, and therefore the forward voltage drop can be reduced compared to the diode of the comparative example.

In FIG. 8, the simulation result of the hole distribution at the time of ON-operation of the diode DIO of the present embodiment (refer to FIG. 3) is shown by the graph of the solid line. By disposing the surface P$^+$-type layer UP on the anode side (refer to FIG. 3) so as correspond to the back surface P$^+$-type layer LP inside the cathode side (refer to FIG. 3) as shown in FIG. 8, the carrier concentration (=electron/hole concentration) right above the back surface P$^+$-type layer LP can be increased by hole injection from the surface P$^+$-type layer UP while preventing the forward voltage drop at the time of ON-operation. In particular, the carrier concentration can be increased in the region closer to the center part of the back surface P$^+$-type layer LP compared to the end of the back surface P$^+$-type layer LP in the lateral direction.

In the comparative example shown in the broken line in FIG. 8, compared to the carrier concentration at the end of the back surface P$^+$-type layer, the carrier concentration dropped by approximately a single digit at the position apart by approximately 150 μm from the end to the inward direction of the back surface P$^+$-type layer. On the other hand, in the diode DIO of the present embodiment shown in the solid line, the carrier concentration can be increased compared to the comparative example at the position apart by approximately 150 μm from the end of the back surface P$^+$-type layer to the inward direction of the back surface P$^+$-type layer.

This is because the effect of hole injection from the back surface of the semiconductor substrate SB (refer to FIG. 3) is promoted by forming the surface P$^+$-type layer UP and increasing the carrier concentration right above the back surface P$^+$-type layer LP. By increasing the carrier concentration inside the semiconductor substrate SB, the width of the OFF-region formed becomes small relative to the back surface P$^+$-type layer LP with a predetermined width at the time of applying the forward voltage compared to the diode of the comparative example (refer to FIG. 27). More specifically, because the portion that operates effectively as a diode inside the semiconductor substrate SB becomes large, the forward voltage drop caused by forming the back surface P$^+$-type layer LP can be prevented.

Also, when the diffusion in the lateral direction of the electrons inside the semiconductor substrate SB at the time of operation of the diode is considered, it is preferable that the width L1 of the back surface P$^+$-type layer LP in the direction along the main surface of the semiconductor substrate SB shown in FIG. 3 is in the range of 200-400 μm, and approximately 350 μm is considered to be optimum in concrete terms.

Further, at the time of the recovery operation, because the effect of hole injection from the back surface is promoted, the plasma region is easily formed in the vicinity of the cathode. Thus, the back surface electric field can be relaxed further, and oscillation (ringing) of the electric current can be suppressed more. In other words, further implementation of soft recovery can be achieved at the time of the recovery operation. Also, the tail electric current component generated by reduction of the electron discharge resistance at the time of the recovery operation can be reduced more. Therefore, by soft recovery implementation and reduction of the tail electric current component, the loss at the time of the recovery operation can be reduced.

Accordingly, it becomes possible to set the area occupancy of the back surface P$^+$-type layer LP lower compared to the comparative example while securing sufficient hole injection effect. Therefore, by narrowing the width of the back surface P$^+$-type layer LP and reducing the area occupancy of the back surface P$^+$-type layer LP, the width of the OFF-region shown in FIG. 27 can be reduced more. Accordingly, even when the area occupancy of the back surface P$^+$-type layer LP is lowered, the forward voltage drop of the diode DIO can be reduced, and sufficient hole injection effect can be secured.

For example, the area occupancy of the back surface P$^+$-type layer LP with respect to the entire area of the back surface of the semiconductor chip CP (refer to FIG. 1) is 5-90%, and the area occupancy of the surface P$^+$-type layer UP with respect to the entire area of the main surface of the semiconductor chip CP is equal to or less than the area occupancy of the back surface P$^+$-type layer LP. In concrete terms, in the present embodiment, the area occupancy of the back surface P$^+$-type layer LP can be made 10%. In this case, the area occupancy of the surface P$^+$-type layer UP is 10% or less. Thus, because the area occupancy of the back surface P$^+$-type layer LP can be reduced to 10% for example, the OFF-region can be made small in the diode DIO of the ON-state. Therefore, the conduct loss inside the diode DIO can be reduced, and the forward voltage drop can be reduced.

The area occupancy of the back surface P$^+$-type layer LP referred to here is a rate calculated by dividing the total area of the area of plural back surface P$^+$-type layers LP in the plan view by the entire area of the back surface of the semiconductor chip CP where the diode DIO is formed.

Also, the area occupancy of the surface P$^+$-type layer UP is a rate calculated by dividing the total area of the area of plural surface P$^+$-type layers UP in the plan view by the entire area of the main surface of the semiconductor chip CP where the diode DIO is formed.

Although to reduce the forward voltage drop and to secure sufficient hole injection effect are in the relationship of trade off in the diode of the comparative example as described above, in the present embodiment, because both of them can be achieved, the semiconductor chip CP including the diode DIO (refer to FIG. 1) can be miniaturized while improving the performance of the diode DIO. Therefore, the performance of the semiconductor device can be improved.

Thus, in the present embodiment, the surface P$^+$-type layer UP is arranged in order to make the surface P$^+$-type layer UP the ON-state and to increase the hole injection amount into the semiconductor substrate SB at the time of the recovery operation. More specifically, the surface P$^+$-type layer UP of the present embodiment is not arranged for the purpose of reducing the hole injection amount from the anode side by making a part of the P-type layer of the main surface of the semiconductor substrate the ON-state. When the electric current density in the anode electrode is higher than a predetermined value, the surface P$^+$-type layer UP is made the ON-state.

Here, the relation of the impurities concentration (peak concentration) of respective layers shown in FIG. 3 will be explained. When the impurities concentration of the anode P-type layer AP is made P1 and the impurities concentration of the surface P$^+$-type layer UP is made P2, in order to secure sufficient hole injection effect, it is preferable that P1/P2 is in the range of 0.0001-0.01. Therefore, for example, the impurities concentration of the anode P-type layer AP is made $1.0 \times 10^{16}$ to $1.0 \times 10^{18}$/cm$^3$, and the concentration of the P-type impurities of each of the surface P$^+$-type layer UP and the back surface P$^+$-type layer LP is made $1.0 \times 10^{19}$ to $1.0 \times 10^{21}$/cm$^3$ for example.

The N$^-$-type layer MN comes to have the impurities concentration optimized in each breakdown voltage because it is the drift layer, and the N-type layer CN is required to have the impurities concentration of a degree not being punched through at the backward voltage of each breakdown voltage. Therefore, the concentration of the N-type impurities of the N-type layer CN is made $1.0 \times 10^{16}$ to $1.0 \times 10^{18}$/cm$^3$ for example. Also, because of the manufacturing step of the semiconductor device described below, the impurities concentration of the back surface P$^+$-type layer LP becomes higher than the impurities concentration of the back surface N$^+$-type layer LN.

<On Method for Manufacturing Semiconductor Device>

Below, a method for manufacturing the semiconductor device of the present embodiment will be explained using FIG. 10 to FIG. 17. FIG. 10 to FIG. 17 are cross-sectional views showing the manufacturing step for the diode that is the semiconductor device of the present embodiment.

Figure 10:
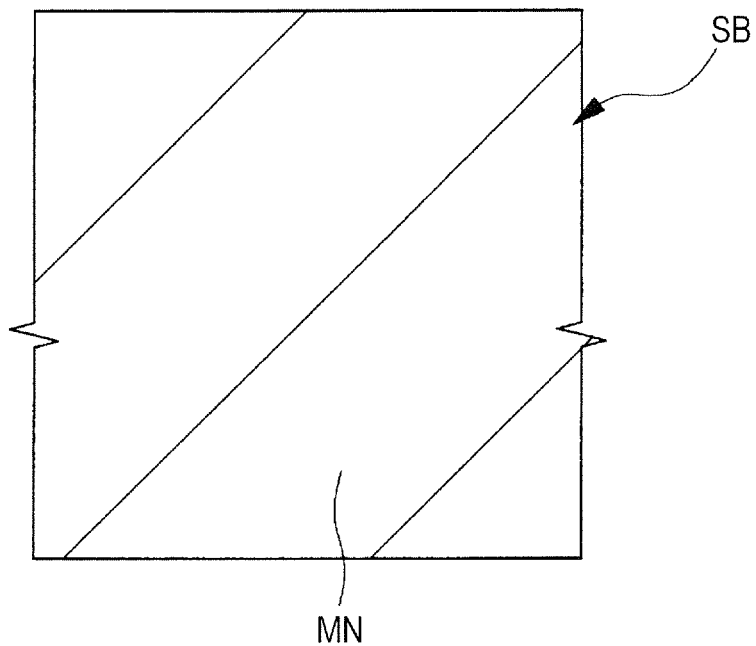
FIG. 10 is a cross-sectional view during a manufacturing step of the semiconductor device of the first embodiment.

First, as shown in FIG. 10, the semiconductor substrate SB is prepared. The semiconductor substrate SB is formed of mono-crystal silicon (Si) for example. For the semiconductor substrate SB, the mono-crystal silicon formed by the CZ method, the MCZ method, the FZ method, or the epitaxial growth method, and the like can be used. The concentration of the N-type impurities of the crystal forming the semiconductor substrate SB is approximately $3.29 \times 10^{13}$ to $4.66 \times 10^{14}$/cm$^3$, and the resistance value of the semiconductor substrate SB is 10-140 Ωcm for example. The impurities concentration and the resistance value can be properly selected according to the usage of the semiconductor device.

The N$^-$-type layer MN is formed in the entirety of the inside of the semiconductor substrate SB.

Figure 11:
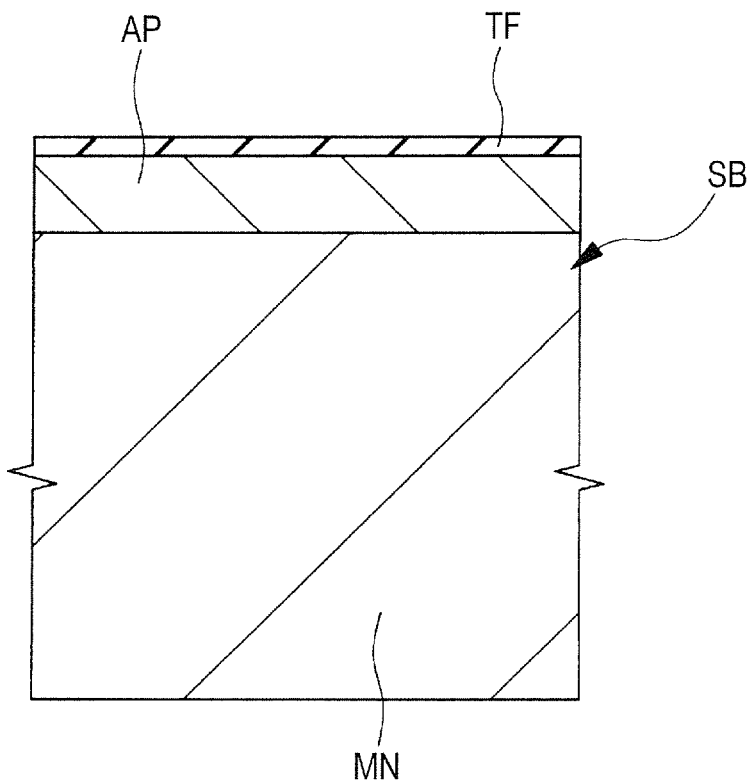
FIG. 11 is a cross-sectional view during a manufacturing step of the semiconductor device subsequent to FIG. 10.

Next, as shown in FIG. 11, an insulation film TF is formed over the semiconductor substrate SB by oxidizing the main surface of the semiconductor substrate SB. The insulation film TF is formed of a silicon oxide film and is used as a through oxide film in subsequent ion injection. More specifically, by forming the insulation film TF, the main surface of the semiconductor substrate SB can be prevented from receiving damage in subsequent ion injection step.

Next, by ion-injection of the p-type impurities (B (boron) for example) to the main surface of the semiconductor substrate SB, the anode P-type layer AP is formed over the main surface of the semiconductor substrate SB. More specifically, the anode P-type layer AP is a P-type semiconductor layer, and is formed over the N$^-$-type layer MN in the inside of the semiconductor substrate SB. The anode P-type layer AP is formed to have the impurities concentration of the range allowing ohmic coupling with the anode electrode formed of a metal film that is formed so as to contact the main surface of the semiconductor substrate SB subsequently. Therefore, it is preferable that the impurities concentration of the anode P-type layer AP is $1.0 \times 10^{16}$ to $1.0 \times 10^{18}$/cm$^3$.

Figure 12:
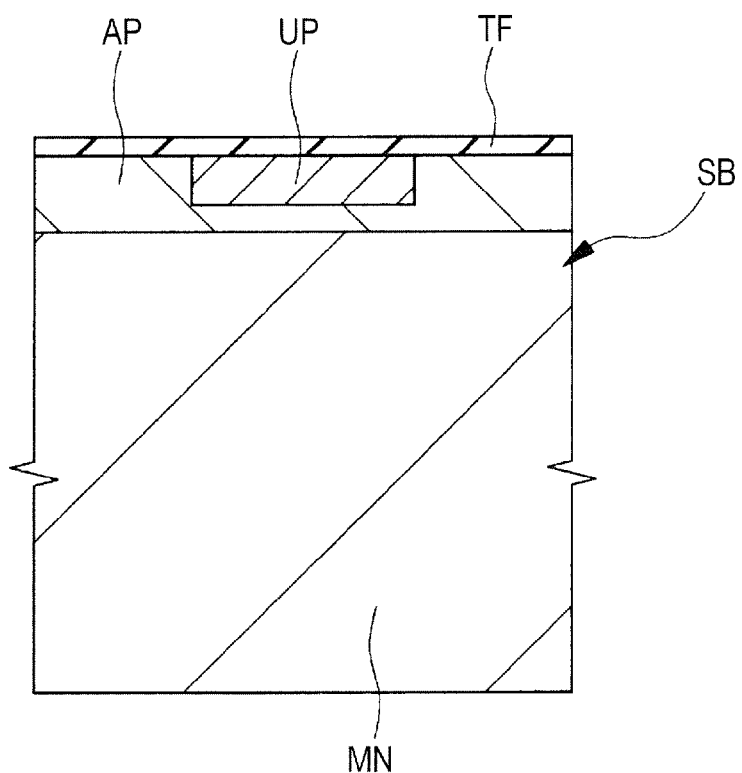
FIG. 12 is a cross-sectional view during a manufacturing step of the semiconductor device subsequent to FIG. 11.

Next, as shown in FIG. 12, after forming a photoresist pattern (not illustrated) over the insulation film TF, the P-type impurities (B (boron) for example) are ion-injected to a part of the main surface of the semiconductor substrate SB with comparatively high concentration using the pattern as a mask. Thereafter, the pattern is removed. Then, activation annealing is performed. Thus, the surface P$^+$-type layer UP is formed in a part of the main surface of the semiconductor substrate SB.

The surface P$^+$-type layer UP is a semiconductor layer whose formation depth is shallower than that of the anode P-type layer AP. More specifically, the anode P-type layer AP is interposed between the surface P$^+$-type layer UP and the N$^-$-type layer MN, and the surface P$^+$-type layer UP and the N$^-$-type layer MN do not contact each other. Plural surface P$^+$-type layers UP are formed in the main surface of the semiconductor substrate SB although illustration thereof is omitted here. The concentration of the P-type impurities of the surface P$^+$-type layer UP is $1.0 \times 10^{19}$ to $1.0 \times 10^{21}$/cm$^3$ for example. The surface P$^+$-type layer UP is formed at a position overlapping with the back surface P$^+$-type layer LP that is formed subsequently in the plan view.

Figure 13:
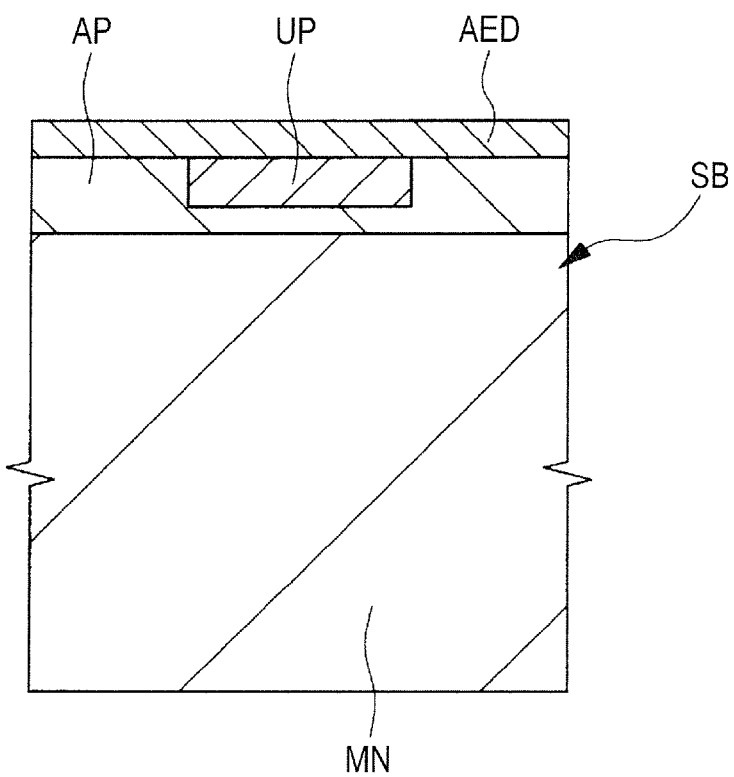
FIG. 13 is a cross-sectional view during a manufacturing step of the semiconductor device subsequent to FIG. 12.

Next, as shown in FIG. 13, after removing the insulation film TF, the anode electrode AED is formed over the main surface of the semiconductor substrate SB using the sputtering method and the like. As the material used for the anode electrode AED, Al, AlSi (Si content is 0.5%-1.5%), AlCu, or AlSiCu can be cited for example. From the viewpoint of preventing the mutual diffusing phenomenon (Al spike) between silicon inside the semiconductor substrate SB and aluminum of the anode electrode AED, it is preferable to use AlSi. The anode electrode AED contacts the upper surface of each of the anode P-type layer AP and the surface P$^+$-type layer UP formed in the main surface of the semiconductor substrate SB. Thereafter, annealing is performed in hydrogen (H$_2$) atmosphere. It is preferable to perform the annealing for 30 min or more at the temperature of 400° C. or above for example.

Figure 14:
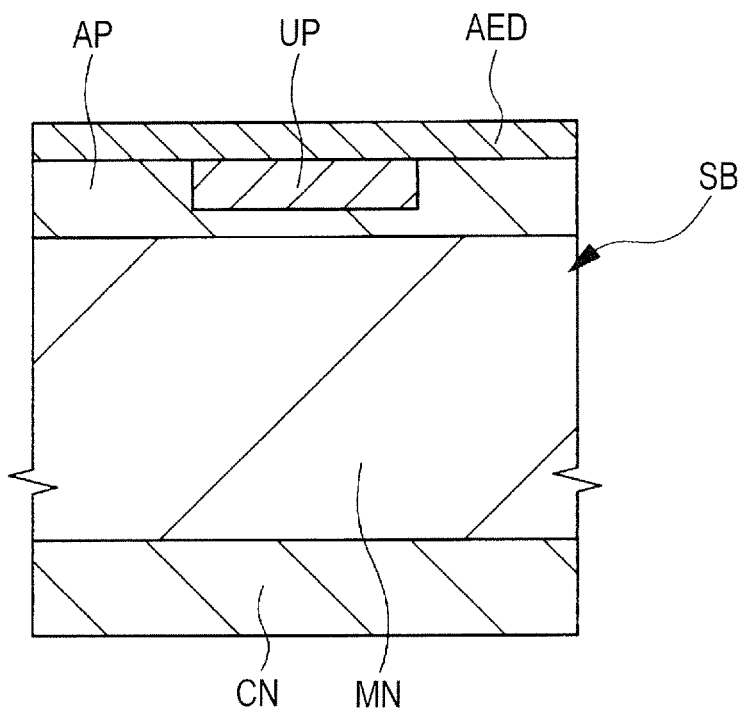
FIG. 14 is a cross-sectional view during a manufacturing step of the semiconductor device subsequent to FIG. 13.

Next, as shown in FIG. 14, the semiconductor substrate is made a thin film by grinding the back surface of the semiconductor substrate SB. Here, it is preferable to make the semiconductor wafer thin so as to be rate-determined by the breakdown voltage. More specifically, the semiconductor substrate SB is made a thin film in a range required breakdown voltage can be maintained in the semiconductor element including the diode DIO formed subsequently. Thus, the internal resistance of the diode DIO can be reduced, and increase of the forward voltage can be prevented.

In other words, here, the semiconductor wafer is made a thin film until being rate-determined by the breakdown voltage. With respect to the PiN-type diode in which the back surface $P^+$-type layer LP described below (refer to FIG. 16) is not arranged, in order to implement soft recovery, it is necessary that the semiconductor wafer used as a carrier accumulation layer has a certain degree of thickness. It is necessary that such semiconductor substrate of the PiN-type diode has the film thickness of approximately 90 µm in the diode of 600 V breakdown voltage, approximately 130 µm in the diode of 1,200 V breakdown voltage, and approximately 180 µm in the diode of 1,800 V breakdown voltage for example.

On the other hand, according to the present embodiment, because soft recovery can be implemented by arranging the back surface $P^+$-type layer LP described below (refer to FIG. 16), it is not necessary to thicken the semiconductor substrate SB. In other words, the semiconductor substrate can be made thin until being rate-determined by the breakdown voltage. Therefore, the semiconductor substrate can be made a thin film to 50 µm in the diode of 600 V breakdown voltage, 100 µm in the diode of 1,200 V breakdown voltage, and 145 µm in the diode of 1,800 V breakdown voltage for example. Because the internal resistance of the diode formed subsequently can be reduced by making the semiconductor substrate a thin film, the conduct loss of the diode can be reduced compared to the PiN-type diode in which the back surface $P^+$-type layer LP is not arranged.

The breakdown voltage of the semiconductor element depends on the crystal concentration (impurities concentration). In other words, the breakdown voltage of the semiconductor element depends on the crystal electrical resistivity. Therefore, considering such factors, when the breakdown voltage of the semiconductor element is assumed to be 600-2,000 V, it is preferable to make the thickness of the semiconductor substrate (semiconductor wafer) SB 40-200 µm for example.

Next, by ion-injection of the N-type impurities (P (phosphor) or As (arsenic) for example) to the entire surface on the opposite side of the main surface of the semiconductor substrate SB, the N-type layer CN is formed in the back surface of the semiconductor substrate SB. In other words, inside the semiconductor substrate SB, the N-type layer CN is formed beneath the $N^-$-type layer MN.

The N-type layer CN has two roles. One is a role of preventing the depletion layer from extending in the inside of the semiconductor substrate SB when a backward voltage is applied to the diode, and the other is a role as a resistance component namely the sheet resistance for inducing hole injection from the back surface of the semiconductor substrate SB at the time of the recovery operation. Therefore, it is preferable that the impurities concentration of the N-type layer CN is $1.0\times10^{16}$ to $1.0\times10^{18}/cm^3$ for example. Thereafter, activation (first annealing) by laser annealing may be performed.

Also, in the step described above explained using FIG. 14 and the steps explained below using FIG. 15 to FIG. 17, ion-injection, film formation and the like are performed overturning the semiconductor substrate SB and directing the back surface upward. However, here, in these steps also, the main surface of the semiconductor substrate SB where the anode P-type layer AP is formed is explained as the upper side, and the back surface that is the surface on the opposite side thereof is explained as the lower side. Also, in the steps explained using FIG. 14 to FIG. 17, although each process is performed with the back surface of the semiconductor substrate SB being directed upward as described above, in FIG. 14 to FIG. 17, the semiconductor substrate SB is shown in the direction similar to that in FIG. 10 to FIG. 13.

Figure 15:
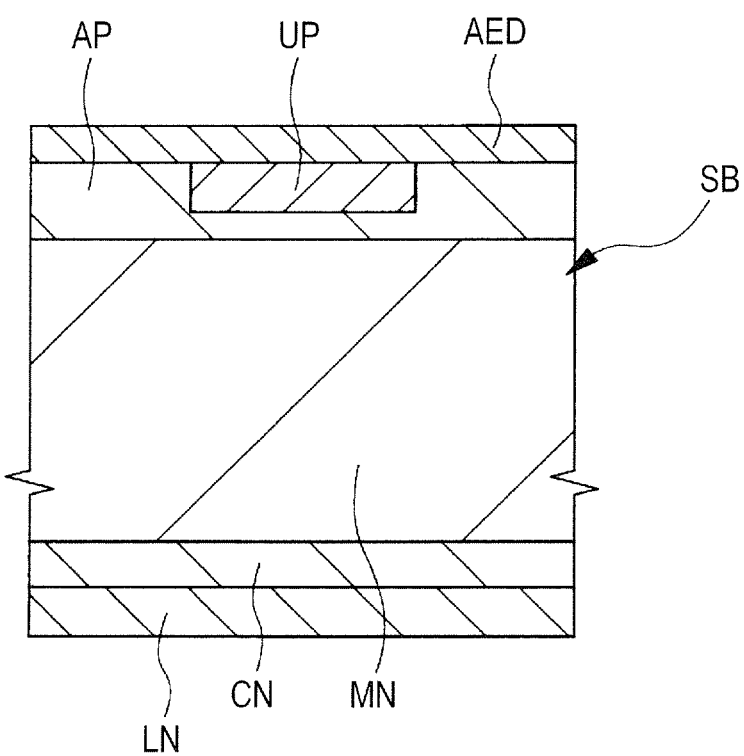
FIG. 15 is a cross-sectional view during a manufacturing step of the semiconductor device subsequent to FIG. 14.

Next, as shown in FIG. 15, by ion-injection of the N-type impurities (P (phosphor) or As (arsenic) for example) with comparatively high concentration to the entire surface of the back surface on the opposite side of the main surface of the semiconductor substrate SB, the back surface $N^+$-type layer LN is formed in the back surface of the semiconductor substrate SB, which means that the back surface $N^+$-type layer LN is formed beneath the N-type layer CN inside the semiconductor substrate SB. In other words, the formation depth of the back surface $N^+$-type layer LN from the back surface of the semiconductor substrate SB is shallower than that of the N-type layer CN. The back surface $N^+$-type layer LN is formed right below the surface $P^+$-type layer UP as well as right below the anode P-type layer AP that is adjacent to the surface $P^+$-type layer UP.

The back surface $N^+$-type layer LN has a role as a cathode layer that injects electrons from the back surface of the semiconductor substrate SB. Because a part of the back surface $N^+$-type layer LN is required to be inverted to the P-type in the step explained using FIG. 16 next, it is preferable that the concentration of the N-type impurities of the back surface $N^+$-type layer LN is in the range of $1.0\times10^{18}$ to $1.0\times10^{21}/cm^3$ for example. Thereafter, activation (second annealing) by laser annealing may be performed.

Figure 16:
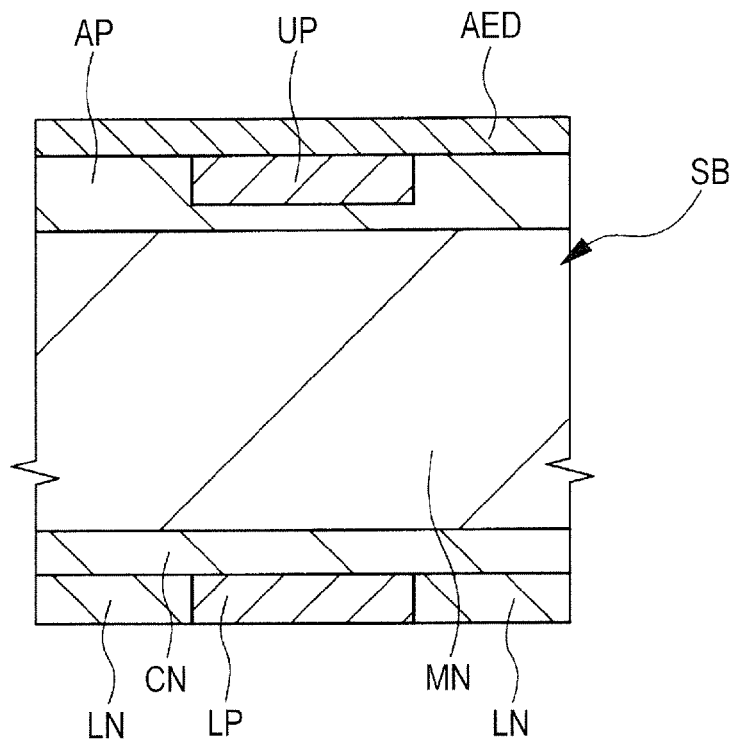
FIG. 16 is a cross-sectional view during a manufacturing step of the semiconductor device subsequent to FIG. 15.

Next, as shown in FIG. 16, after covering the back surface of the semiconductor substrate SB by a photoresist pattern (not illustrated), the P-type impurities (B (boron) for example) are ion-injected with comparatively high concentration to a part of the back surface of the semiconductor substrate SB using the pattern as a mask. Thereafter, the pattern is removed. Then, activation (third annealing) is performed by laser annealing. Thus, the back surface $P^+$-type layer LP is formed in a part of the main surface of the semiconductor substrate SB.

At this time, the formation position of the photoresist pattern is adjusted so as to form the back surface $P^+$-type layer LP right below the surface $P^+$-type layer UP. More specifically, the terminal end parts of each of the back surface $P^+$-type layer LP and the surface $P^+$-type layer UP overlap with each other in the plan view. It is preferable that the concentration of the P-type impurities of the back surface $P^+$-type layer LP is in the range of $1.0\times10^{18}$ to $1.0\times10^{21}/cm^3$ for example. However, because the back surface $P^+$-type layer LP is formed with the back surface $N^+$-type layer LN being inverted as described above, the impurities concentration of the back surface $N^+$-type layer LN becomes lower than the impurities concentration of the back surface $P^+$-type layer LP.

Figure 17:
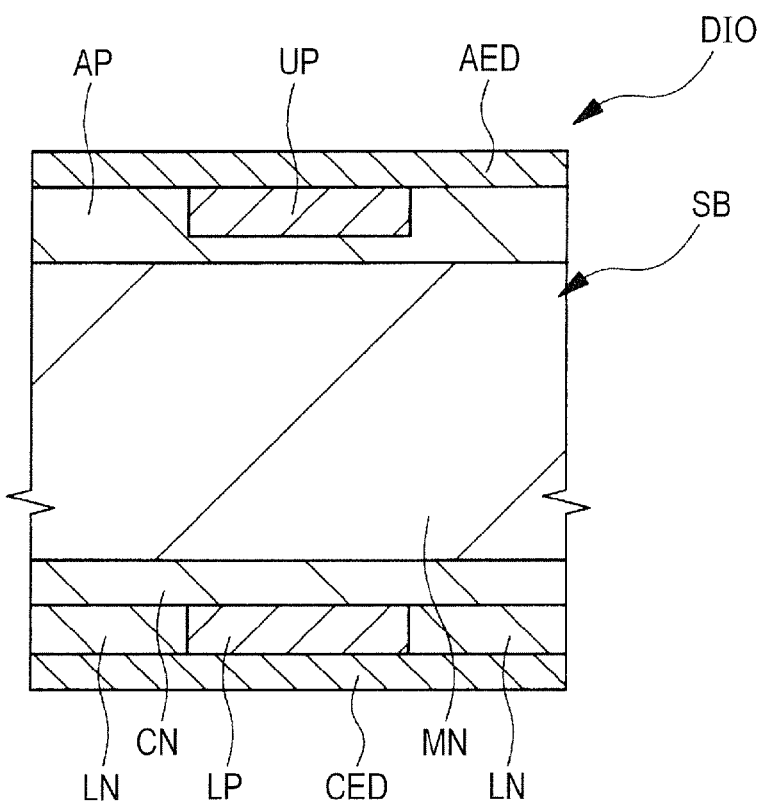
FIG. 17 is a cross-sectional view during a manufacturing step of the semiconductor device subsequent to FIG. 16.

Next, as shown in FIG. 17, the cathode electrode CED is formed beneath the back surface of the semiconductor substrate SB so as to contact the back surface of the semiconductor substrate SB using a sputtering method for example. The cathode electrode CED has a laminated structure in which plural metal films for example are laminated, and includes a laminated film laminating Ni/Ti/Ni/Au in this order from the back surface side of the semiconductor substrate SB or a laminated film laminating AlSi/Ti/Ni/Au in this order from the back surface side of the semiconductor substrate SB for example.

As described above, the diode DIO that is the semiconductor device of the present embodiment is formed. The diode DIO is a P-N junction diode formed by P-N junction of the P-type layer including the anode P-type layer AP formed inside the semiconductor substrate SB and the N-type layer including the N$^-$-type layer MN, the N-type layer CN, and the back surface N$^+$-type layer LN, and further includes the back surface P$^+$-type layer LP and the surface P$^+$-type layer UP.

Here, after each step of FIG. 14, FIG. 15, and FIG. 16, there are chances of performing the first, second, and third annealing using the laser as described above, and it is preferable to perform laser annealing twice out of the chances of 3 times. These heat treatments are performed with the main aim of activating the N-type layer CN. Thus, by increasing the impurities activation ratio of the N-type layer CN to 60-70%, the property of the diode DIO can be improved.

In other words, in a non-activated portion out of the N-type layer CN, because the defect caused by ion-injection that is performed with the aim of forming the N-type layer CN and the like remains, the hole is prevented from being injected from the surface P$^+$-type layer UP to the N-type layer CN at the time of the recovery operation. As a result, it is hard to secure the hole injection effect sufficiently. Therefore, when laser annealing of twice is performed and the impurities activation ratio of the N-type layer CN is increased, increase of the forward voltage drop can be prevented, and implementation of soft recovery can be achieved. Also, when the impurities activation ratio of the N-type layer CN is increased, the breakdown voltage leakage characteristic of the semiconductor device can be improved also.

Out of the laser annealing of twice described above, the first laser annealing is performed at either the timing immediately after the forming step of the N-type layer CN explained using FIG. 14 and before forming the back surface N$^+$-type layer LN, or the timing immediately after the forming step of the back surface N$^+$-type layer LN explained using FIG. 15 and before forming the back surface P$^+$-type layer LP. Also, the second laser annealing out of the laser annealing of twice described above is performed at the timing immediately after the forming step of the back surface P$^+$-type layer LP explained using FIG. 16 and before forming the cathode electrode CED.

Further, although it is also possible to perform laser annealing only once out of the chances of 3 times described above, from the viewpoint of recovering the defect caused by ion-injection and the like, it is preferable to perform laser annealing twice. When laser annealing is performed only once, the timing thereof is the time immediately after the forming step of the back surface P$^+$-type layer LP explained using FIG. 16 and before forming the cathode electrode CED.

It is preferable that the treatment condition of each of the laser annealing performed once or twice as described above is made laser wavelength: 527 nm, laser energy density: 1.8 J/cm$^2$ (2 pulses), laser pulse width: 100 ns, laser pulse delay time: 500 ns, and laser pulse overlap rate: 66%.

The diode of the present embodiment formed by the method explained using FIG. 10 to FIG. 17 operates similarly to the diode explained using FIG. 4 to FIG. 6, FIG. 8, and FIG. 9, and exhibits the effects similar to those explained using FIG. 8 and FIG. 9. More specifically, in the diode DIO of the present embodiment, because the back surface P$^+$-type layer LP is formed and the surface P$^+$-type layer UP is formed, the occupancy of the back surface P$^+$-type layer LP can be set low while securing sufficient hole injection effect. Therefore, the forward voltage drop of the diode DIO can be reduced, and sufficient hole injection effect can be secured. Accordingly, the performance of the semiconductor device can be improved.

<Semiconductor Device of Modification>

Figure 18:
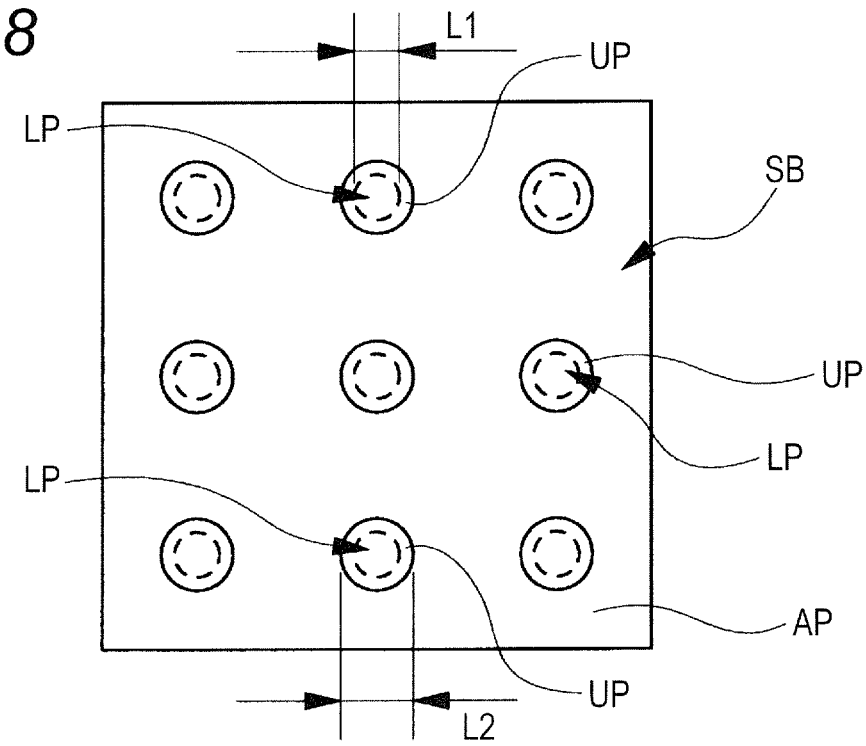
FIG. 18 is a plan view showing a modification of the semiconductor device of the first embodiment.
Figure 19:
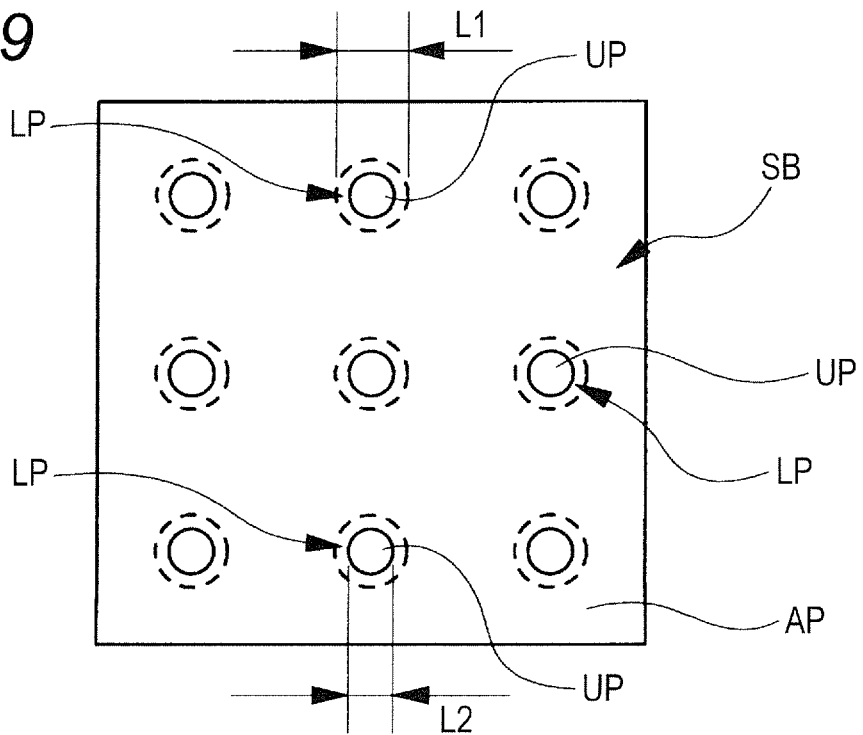
FIG. 19 is a plan view showing a modification of the semiconductor device of the first embodiment.

Below, the modification of the semiconductor device of the present embodiment will be explained using FIG. 18 and FIG. 19. FIG. 18 and FIG. 19 are plan views showing the modification of the semiconductor device of the present embodiment. In FIG. 18 and FIG. 19, similarly to FIG. 2, the main surface of the semiconductor substrate and the surface P$^+$-type layer UP are shown transparently through the anode electrode, and the profile of the back surface P$^+$-type layer LP formed in the back surface of the semiconductor substrate is shown in the broken line.

As shown in FIG. 18, the width L1 of the back surface P$^+$-type layer LP may be smaller than the width L2 of the surface P$^+$-type layer UP. Here, the back surface P$^+$-type layer LP terminates in the inside of the surface P$^+$-type layer UP in the plan view. Also, as shown in FIG. 19, the width L1 of the back surface P$^+$-type layer LP may be larger than the width L2 of the surface P$^+$-type layer UP. Here, the back surface P$^+$-type layer LP terminates in the outside of the surface P$^+$-type layer UP in the plan view.

In both of FIG. 18 and FIG. 19, the width L1 of the back surface P$^+$-type layer LP and the surface P$^+$-type layer UP overlap in the plan view. As described below in the fourth embodiment, from the viewpoint of promoting the hole injection effect, it is preferable that the surface P$^+$-type layer UP is disposed at least right above the back surface P$^+$-type layer LP in the vicinity of the terminal end part of the end of the back surface P$^+$-type layer LP. More specifically, as shown in FIG. 19, when the surface P$^+$-type layer UP is smaller than the back surface P$^+$-type layer LP, it is preferable that a part of the surface P$^+$-type layer UP is disposed at a position that overlaps with the region within the range of 50-100 nm from the terminal end part of the back surface P$^+$-type layer LP toward the center side of the back surface P$^+$-type layer LP in the plan view.

Second Embodiment

Figure 20:
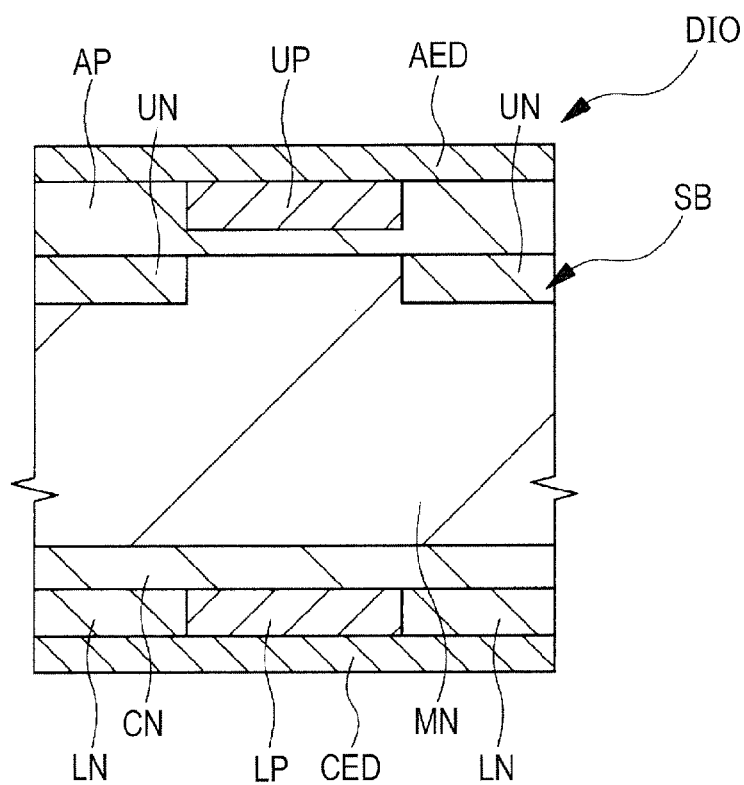
FIG. 20 is a cross-sectional view showing a semiconductor device of the second embodiment.

To improve the performance of the semiconductor device by further arranging the N-type layer inside the semiconductor substrate will be explained using FIG. 20. FIG. 20 is a cross-sectional view showing the semiconductor device of the present embodiment. In the structure of the semiconductor device of the present embodiment, the point different from the first embodiment described above is only the point that an N-type layer UN is formed so as to contact the lower surface of the anode P-type layer AP which is in the inside of the semiconductor substrate SB and do not overlap with the surface P$^+$-type layer UP in the plan view.

In other words, the N-type layer UN that is an N-type semiconductor layer having higher impurities concentration compared to the N$^-$-type layer MN is formed between the N$^-$-type layer MN and the anode P-type layer AP. The N-type layer UN formed in the first region is adjacent in the lateral direction to a part of the N$^-$-type layer MN that is formed in the second region. Also, the N-type layer UN is not formed between the back surface P$^+$-type layer LP and the surface P$^+$-type layer UP. Although illustration is omitted, the N-type layer UN has plural openings in the plan view, and the back surface P+-type layer LP and the surface P+-type layer UP are formed so as to overlap with the openings.

By forming the N-type layer UN thus, hole injection from the anode electrode side can be reduced. Thus, by reducing the recrystallization center namely the life time killer which becomes a cause of shortening of the life time of the carrier such as the holes, the relation between the forward voltage drop and the recovery loss can be improved. In particular, by increasing the impurities concentration of the N-type layer UN, the processing speed of the semiconductor device can be increased.

Although the N-type layer UN has a role of suppressing injection of the holes from the anode electrode AED side in the anode P-type layer AP, because it is not necessary to suppress the amount of the holes injected from the surface P+-type layer UP, the N-type layer UN is not formed right below the surface P+-type layer UP in order to promote the hole injection effect.

The N-type layer UN can be formed in the step explained using FIG. 11 for example after forming the insulation film TF and before forming the anode P-type layer AP using the ion injection method and the like. In order to secure the effect described above, it is preferable that the impurities concentration of the N-type layer UN is lower than the impurities concentration of the N-type layer CN. Here, the impurities concentration of the N-type layer CN is of a same degree to the impurities concentration of the anode P-type layer AP, and the impurities concentration of the N-type layer UN is lower than the impurities concentration of the anode P-type layer AP.

Third Embodiment

Figure 21:
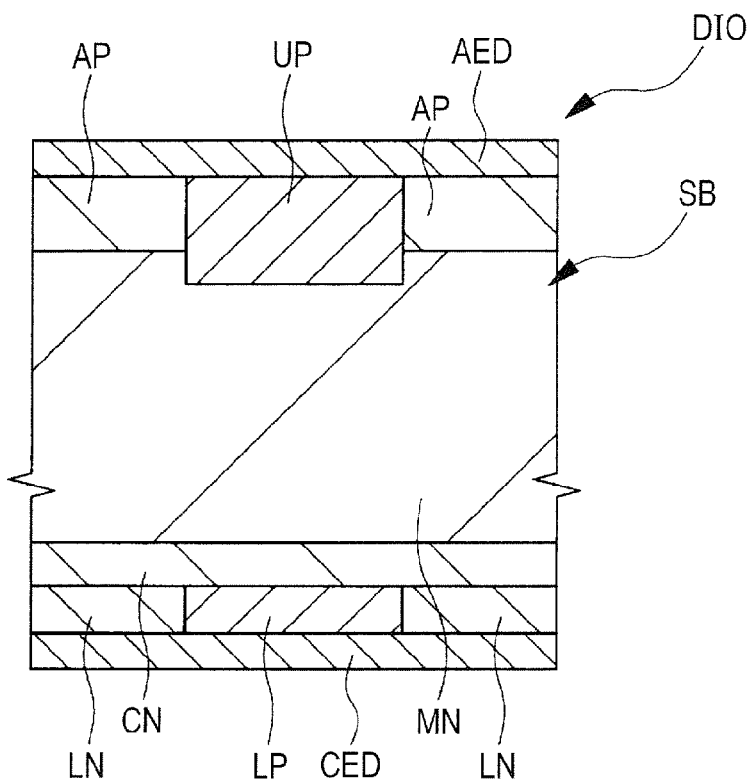
FIG. 21 is a cross-sectional view showing a semiconductor device of the third embodiment.

To prevent operation of the parasitic bipolar transistor in the diode by deepening the formation depth of the surface P+-type layer UP will be explained using FIG. 21. FIG. 21 is a cross-sectional view showing the semiconductor device of the present embodiment. In the structure of the semiconductor device of the present embodiment, the point different from the first embodiment described above is only the point that the formation depth of the surface P+-type layer UP is deeper than that of the anode P-type layer AP. In other words, the surface P+-type layer UP directly contacts the N−-type layer MN. However, the bottom part of the surface P+-type layer UP does not reach the N-type layer CN.

In the present embodiment, the effect secured with respect to the forward voltage drop and the recovery loss is similar to that of the first embodiment described above. In the present embodiment, when avalanche destruction occurs at the time of the recovery operation, because it can be expected that the holes are discharged from the surface P+-type layer UP that has higher concentration than the anode P-type layer AP, operation of the parasitic bipolar transistor can be prevented. Therefore, the event that the diode DIO does not operate normally can be prevented.

Third Embodiment

Figure 22:
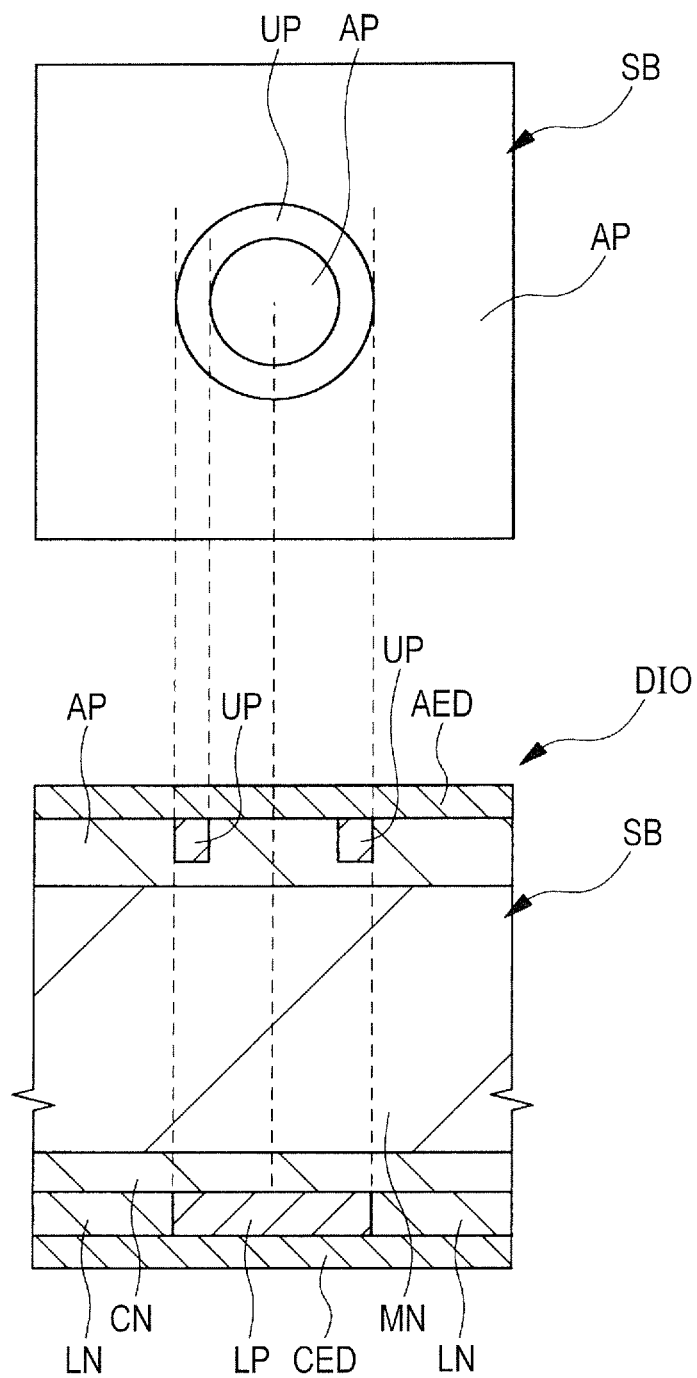
FIG. 22 is a plan view and a cross-sectional view showing a semiconductor device of the fourth embodiment.

To form a surface P+-type layer in a part of the region right above the back surface P+-type layer will be explained using FIG. 22. FIG. 22 is a plan view and a cross-sectional view showing the semiconductor device of the present embodiment. In FIG. 22, a plan view of a part of the diode is shown in the upper side of the drawing, and a cross-sectional view of the diode at the position corresponding to the plan view is shown in the lower side of the drawing. In the structure of the semiconductor device of the present embodiment, the point different from the first embodiment described above is only the shape of the surface P+-type layer UP shown in FIG. 22.

As shown in FIG. 22, in the diode DIO of the present embodiment, the surface P+-type layer UP is not formed in the entirety of the region right above the back surface P+-type layer LP. The surface P+-type layer UP has an annular structure in the plan view. The profile of the outside and inside of the surface P+-type layer UP in the plan view is a circular shape. In other words, the surface P+-type layer UP has an annular pattern in the plan view.

Similarly to the first embodiment described above, the terminal end part of the outside of the surface P+-type layer UP overlaps with the terminal end part of the outside of the back surface P+-type layer LP in the plan view. More specifically, although the surface P+-type layer UP is formed right above the end of the back surface P+-type layer LP, the surface P+-type layer UP is not formed in the region right above the center part of the back surface P+-type layer LP unlike the first embodiment described above, and the anode P-type layer AP is formed in the main surface of the semiconductor substrate SB in the region.

The promotion effect of the hole injection secured by arranging the surface P+-type layer UP can be secured similarly to the first embodiment described above even when the surface P+-type layer UP is not formed in the entirety of the region right above the back surface P+-type layer LP as the present embodiment. The reason is that, out of the entire surface P+-type layer UP, the surface P+-type layer UP right above the region in the vicinity of the end of the back surface P+-type layer LP contributes to promotion of the hole injection effect. More specifically, from the viewpoint of promoting the hole injection effect, it is important that the surface P+-type layer UP is formed not right above the center part of the back surface P+-type layer LP but right above the back surface P+-type layer LP in the vicinity of the end of the back surface P+-type layer LP.

Here, the region where the pattern of the surface P+-type layer UP must be arranged at the minimum in order to promote the hole injection effect will be explained below.

In order to promote the hole injection effect from the back surface of the semiconductor substrate SB, it is necessary that the surface P+-type layer UP having the width of 50 μm or more is formed within the range right above the region of 100 μm or less from the end of the back surface P+-type layer LP in the lateral direction. In FIG. 22, although the end of the back surface P+-type layer LP in the lateral direction and the end in the outside of the surface P+-type layer UP in the same direction are in line in the plan view, they are not required to be in line in the plan view.

As described above, the shape of the surface P+-type layer UP can be changed appropriately while securing the promotion effect of hole injection as the surface P+-type layer UP having a hollow pattern shown in FIG. 22.

Fifth Embodiment

Figure 23:
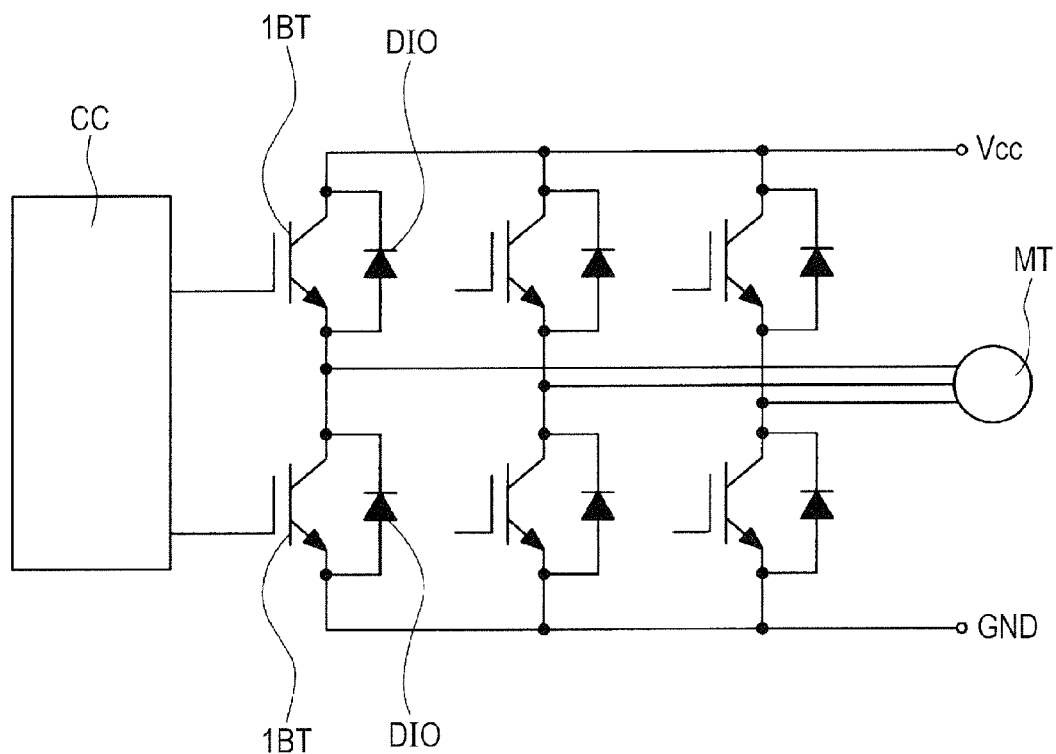
FIG. 23 is a circuit diagram showing an inverter utilizing a semiconductor device of the fifth embodiment.
Figure 24:
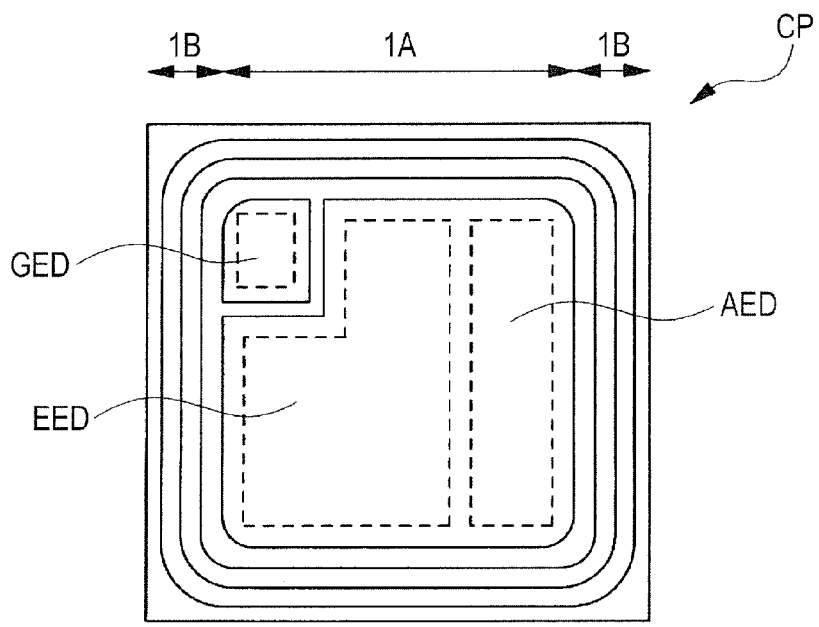
FIG. 24 is a plan view showing the semiconductor device of the fifth embodiment.
Figure 25:
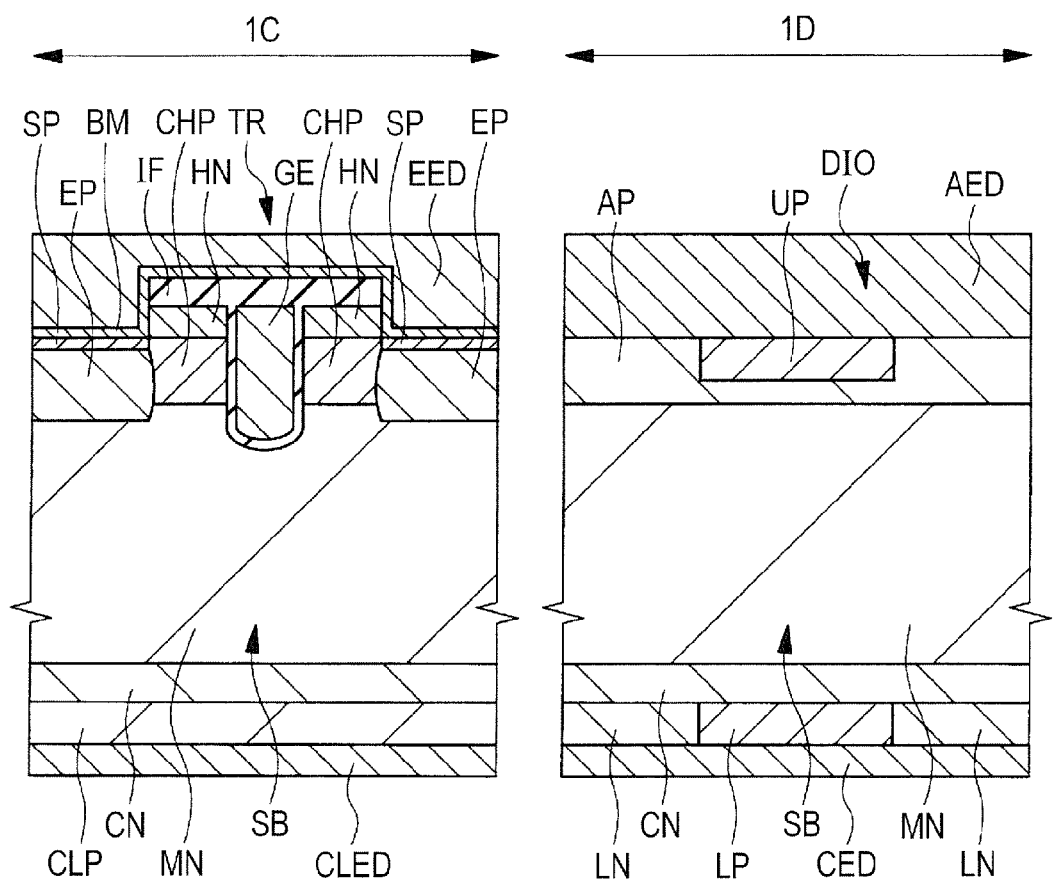
FIG. 25 is a cross-sectional view showing the semiconductor device of the fifth embodiment.

To form not only the diode but also an insulated gate bipolar transistor in the semiconductor chip will be explained using FIG. 23 to FIG. 25. FIG. 23 is a circuit diagram showing an inverter utilizing the semiconductor device of the present embodiment. FIG. 24 is a plan view showing the semiconductor device of the present embodiment. FIG. 25 is a cross-sectional view showing the semiconductor device of the present embodiment.

In FIG. 24, a plan view of a semiconductor chip including a diode and a bipolar transistor is shown. In FIG. 24, an element region 1A in the semiconductor chip and a termination region 1B around the element region 1A are shown. In FIG. 25, a cross-sectional view of a transistor region 1C is shown in the left side of the drawing, and a cross-sectional view of a diode region 1D is shown in the right side of the drawing. In the structure of the semiconductor device of the present embodiment, the point different from the first embodiment described above is only the point that, in the semiconductor chip provided with the diode, the bipolar transistor is provided in addition to the diode.

The inverter shown in FIG. 22 includes an IGBT (Insulated Gate Bipolar Transistor) 1BT which is a switching element and the diode DIO by plural numbers respectively inside the power module. In each single phase, the IGBT 1BT and the diode DIO are coupled with each other between the electric source voltage Vcc and the input potential of a load (motor for example) MT in an antiparallel fashion, and these elements form the upper arm. Further, the IGBT 1BT and the diode DIO are coupled with each other also between the input potential of the load MT and grounding potential GND in an antiparallel fashion, and these elements form the lower arm.

In other words, in the load MT, two IGBTs 1BT and two diodes DIO are arranged in each single phase, and six IGBTs 1BT and six diodes DIO are arranged in three phases.

The electric source voltage Vcc is coupled with the collector electrode of the IGBT 1BT of each single phase, and the grounding potential GND is coupled with the emitter electrode of the IGBT 1BT of each single phase. Also, the load MT is coupled with the emitter electrode of the IGBT 1BT of each single phase of the upper arm, and with the collector electrode of the IGBT 1BT of each single phase of the lower arm.

Further, a control circuit CC is coupled with the gate electrode of each IGBT 1BT, and the IGBT 1BT is controlled by this control circuit CC. Therefore, the inverter of the present embodiment can drive the load MT by controlling the electric current flowing through the IGBT 1BT that forms the power module by the control circuit CC.

The IGBT 1BT is a bipolar transistor described below using FIG. 25. The diode DIO is a rectifying element jointly mounted on the semiconductor chip CP (refer to FIG. 24) along with the IGBT 1BT.

The function of the IGBT 1BT within the power module described above will be explained below. In order to control and drive the motor for example as the load MT, the sinusoidal wave of a desired voltage is required to be inputted to the load MT. The control circuit CC controls the IGBT 1BT and performs a pulse width modulation operation of dynamically changing the pulse width of the rectangular wave. The rectangular wave outputted is smoothed by going through the inductor, and becomes the desired pseudo-sinusoidal wave. The IGBT 1BT creates the rectangular wave for performing this pulse width modulation operation. According to such 3-phase motor, the motor can be operated more smoothly and with higher output.

Next, the semiconductor chip CP shown in FIG. 24 will be explained. The semiconductor chip CP shown in FIG. 24 includes the element region 1A and the termination region 1B around the element region 1A similarly to the semiconductor chip CP shown in FIG. 1. In the semiconductor chip CP of the present embodiment shown in FIG. 24, the IGBT 1BT (refer to FIG. 23) of each single phase described above and the diode DIO (refer to FIG. 23) of the single phase are arranged within the element region 1A. In FIG. 24, a gate electrode GED, an emitter electrode EED, and the anode electrode AED are shown within the element region 1A. The region where the gate electrode GED and the emitter electrode EED are formed is the transistor region 1C (refer to FIG. 25), and the region where the anode electrode AED is formed is the diode region 1D (refer to FIG. 25).

The emitter electrode EED and the anode electrode AED formed over the semiconductor substrate form a same metal film. In other words, the emitter electrode EED and the anode electrode AED are physically and electrically coupled with each other. In FIG. 24, out of the metal film, the region where the diode is formed and the region where the bipolar transistor is formed are distinguished by the broken line.

Next, a bipolar transistor TR and the diode DIO shown in FIG. 25 will be explained. As shown in FIG. 25, in the semiconductor substrate SB, the transistor region 1C and the diode region 1D adjacent to each other in the lateral direction exist, the bipolar transistor TR is formed in the transistor region 1C, and the diode DIO is formed in the diode region 1D. The structure of the diode DIO is similar to that of the first embodiment described above.

Here, the area occupancy of the back surface $P^+$-type layer LP with respect to the area of the formation region of the diode DIO out of the area of the back surface of the semiconductor chip CP (refer to FIG. 24) is 5-90%, and the area occupancy of the surface $P^+$-type layer UP with respect to the area of the formation region of the diode DIO out of the area of the main surface of the semiconductor chip CP is equal to or less than the area occupancy of the back surface $P^+$-type layer LP. In concrete terms, in the present embodiment, the area occupancy of the back surface $P^+$-type layer LP with respect to the area of the formation region of the diode DIO can be made 10%.

In the transistor region 1C, in the inside of the semiconductor substrate SB, the $N^-$-type layer MN, the N-type layer CN that is formed beneath the $N^-$-type layer MN, and a collector P-type layer CLP that is formed in the back surface of the semiconductor substrate SB and beneath the N-type layer CN are formed. The collector P-type layer CLP forms a collector layer of the bipolar transistor TR. The lower surface of the collector P-type layer CLP is coupled with a collector electrode CLED that is the back surface electrode formed so as to contact the back surface of the semiconductor substrate SB. The collector electrode CLED and the cathode electrode CED of the diode region 1D are formed by a film that is formed by a same step, are not separated from each other, and are electrically coupled with each other.

In other words, the emitter of the bipolar transistor TR is coupled with the anode of the diode DIO, and the collector of the bipolar transistor TR is coupled with the cathode of the diode DIO. More specifically, the bipolar transistor TR and the diode DIO are coupled with each other in an antiparallel fashion.

In the inside of the semiconductor substrate SB, over the N-type layer CN, a pair of emitter P-type layers EP arrayed in the lateral direction are formed, and, over each of the pair of emitter P-type layers EP, a $P^+$-type layer SP is formed in the main surface of the semiconductor substrate SB. The $P^+$-type layer SP is a high concentration semiconductor layer for reducing the coupling resistance between the emitter P-type layers EP and the emitter electrode over the main surface of the semiconductor substrate SB. The emitter P-type layers EP and the $P^+$-type layer SP form the emitter layer of the bipolar transistor TR.

In the inside of the semiconductor substrate SB and between each of the pair of emitter P-type layers EP adjacent to each other in the lateral direction, a pair of P-type layers CHP are formed. Right above each of the pair of P-type layers CHP, an N$^+$-type layer HN is formed. A groove is formed between each of the pair of N$^+$-type layers HN and between each of the pair of P-type layers CHP, and a gate electrode GE is formed inside the groove through an insulation film IF. More specifically, the gate electrode GE is formed over the main surface of the semiconductor substrate, and the gate electrode GE is insulated against the semiconductor substrate SB. In other words, the bipolar transistor TR is an insulated gate bipolar transistor. The groove starts from the height of the upper surface of the N$^+$-type layer HN and reaches the middle depth of the N$^-$-type layer MN. The gate electrode GE is insulated against the N$^+$-type layer HN, the P-type layer CHP, the N$^-$-type layer MN, and the semiconductor substrate SB by the insulation film IF.

The upper surface of the gate electrode GE and the upper surface of each of the pair of N$^+$-type layers HN are covered with the insulation film IF. The emitter electrode EED is formed over each of the semiconductor substrate SB, the pair of N$^+$-type layers HN, the gate electrode GE, and the insulation film IF through a barrier metal film BM. The barrier metal film BM contacts the upper surface of the P$^+$-type layer SP, and contacts the side wall of the N$^+$-type layers HN. Also, the gate electrode GE is coupled with the gate electrode GED (refer to FIG. 24) that is used as a pad in a region not illustrated.

The bipolar transistor TR is an element including the gate electrode GE, the emitter P-type layers EP, the collector electrode CLED, and the collector P-type layer CLP. As shown in FIG. 25, the diode DIO that can promote the hole injection effect by arranging the back surface P$^+$-type layer LP and the surface P$^+$-type layer UP can be mounted on the semiconductor chip CP (refer to FIG. 24) jointly along with the bipolar transistor TR. Thus, the degree of freedom of the design of the semiconductor device can be increased.

Although the invention achieved by the present inventors has been explained above specifically based on the embodiments, it is needless to mention that the present invention is not limited to the embodiments and various alterations are possible within a region not deviating from the purposes thereof.

What is claimed is:

1. A semiconductor device that comprises a diode, the diode comprising:
    a semiconductor substrate that includes a first region and a second region which are adjacent to each other in the direction along a main surface;
    a first P-type layer formed in the main surface of the semiconductor substrate in the first region;
    a second P-type layer formed in the main surface of the semiconductor substrate in the second region;
    a first N-type layer formed in a back surface on the opposite side of the main surface of the semiconductor substrate in the first region;
    a third P-type layer formed in the back surface of the semiconductor substrate in the second region;
    a second N-type layer formed inside the semiconductor substrate so as to contact the upper surface of each of the first N-type layer and the third P-type layer in the first region and the second region;
    a semiconductor layer formed between the second N-type layer and the first and second P-type layers in the first and second regions;
    a first electrode formed so as to contact the main surface of the semiconductor substrate and electrically coupled with each of the first and second P-type layers; and
    a second electrode formed so as to contact the back surface of the semiconductor substrate and electrically coupled with the first N-type layer and the third P-type layer,
    wherein the impurities concentration of the second N-type layer and the second P-type layer is higher than that of the semiconductor layer,
    wherein the impurities concentration of the second P-type layer is higher than that of the first P-type layer,
    wherein the impurities concentration of the first N-type layer is higher than that of the second N-type layer, and
    wherein the second P-type layer is formed right above the third P-type layer.

2. The semiconductor device according to claim 1, wherein the impurities concentration of the third P-type layer is higher than that of the second N-type layer.

3. The semiconductor device according to claim 1, wherein the second P-type layer has an annular pattern in a plan view, and
    wherein a part of the first P-type layer is formed in the main surface of the semiconductor substrate in the inside of the annular pattern.

4. The semiconductor device according to claim 1, wherein the second P-type layer is formed within a region right above a region of 100 μm or less from the end of the third P-type layer toward the center of the third P-type layer in the direction along the main surface of the semiconductor substrate with the width of 50 μm or more in the direction along the main surface of the semiconductor substrate.

5. The semiconductor device according to claim 1, wherein the formation depth of the first P-type layer from the main surface of the semiconductor substrate is deeper than the formation depth of the second P-type layer from the main surface of the semiconductor substrate, and
    wherein a part of the first P-type layer contacts the lower surface of the second P-type layer in the second region.

6. The semiconductor device according to claim 1, wherein the formation depth of the first P-type layer from the main surface of the semiconductor substrate is shallower than the formation depth of the second P-type layer from the main surface of the semiconductor substrate.

7. The semiconductor device according to claim 1, wherein the area of the second P-type layer is smaller than the area of the third P-type layer in a plan view.

8. The semiconductor device according to claim 1, wherein the area of the second P-type layer is larger than the area of the third P-type layer in a plan view.

9. The semiconductor device according to claim 1, wherein a third N-type layer whose impurities concentration is lower than that of the second N-type layer and higher than that of the semiconductor layer is formed between the semiconductor layer and the first P-type layer in the first region.

10. The semiconductor device according to claim 1, wherein the semiconductor layer is an N-type semiconductor layer or an intrinsic semiconductor layer.

11. The semiconductor device according to claim 1, wherein the width of the third P-type layer in a plan view is 200-400 μm.

12. The semiconductor device according to claim 11, wherein the width of the second P-type layer in a plan view is 200-400 μm.

13. The semiconductor device according to claim 1,
  wherein the area occupancy of the second P-type layer in the back surface of the semiconductor substrate is less than 30%.
14. The semiconductor device according to claim 1,
  wherein the impurities activation ratio of the second N-type layer is 60-70%.
15. The semiconductor device according to claim 1,
  wherein the semiconductor substrate includes a third region that is different from the first and second region,
  wherein, in the third region, a bipolar transistor is formed which includes a collector layer formed in the back surface of the semiconductor substrate, an emitter layer formed in the main surface of the semiconductor substrate, and a gate electrode formed over the main surface of the semiconductor substrate,
  wherein the emitter layer is electrically coupled with the first electrode, and
  wherein the collector layer is electrically coupled with the second electrode.

* * * * *